United States Patent
Shim et al.

(10) Patent No.: US 11,552,152 B2
(45) Date of Patent: Jan. 10, 2023

(54) DISPLAY DEVICE INCLUDING A POWER SUPPLY VOLTAGE WIRING HAVING OPENINGS

(71) Applicant: SAMSUNG DISPLAY CO., LTD., Yongin-si (KR)

(72) Inventors: Hyunsub Shim, Yongin-si (KR); Sunyoul Lee, Yongin-si (KR); Sun-Kyo Jung, Yongin-si (KR); Sungho Cho, Yongin-si (KR); Sooyeon Han, Yongin-si (KR); Hyunae Park, Yongin-si (KR); Ji-Eun Lee, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 2 days.

(21) Appl. No.: 16/250,044

(22) Filed: Jan. 17, 2019

(65) Prior Publication Data
US 2019/0229176 A1    Jul. 25, 2019

(30) Foreign Application Priority Data
Jan. 23, 2018   (KR) .................. 10-2018-0008363

(51) Int. Cl.
*H01L 27/32*   (2006.01)
*H01L 51/52*   (2006.01)
*H01L 51/56*   (2006.01)

(52) U.S. Cl.
CPC ...... *H01L 27/3276* (2013.01); *H01L 27/3258* (2013.01); *H01L 51/5221* (2013.01);
(Continued)

(58) Field of Classification Search
CPC ............ H01L 27/3276; H01L 27/3258; H01L 27/323; H01L 51/5221; H01L 51/5234; H01L 51/5246; H01L 51/56
(Continued)

(56) References Cited

U.S. PATENT DOCUMENTS 7,492,432 B2   2/2009   Park et al.
7,538,488 B2   5/2009   Kwak
(Continued)

FOREIGN PATENT DOCUMENTS

CN   1658713   8/2005
CN   1797152   7/2006
(Continued)

OTHER PUBLICATIONS

Chinese Office Action for Chinese Patent Application or Patent No. 201910062784.3, dated Oct. 25, 2021.

*Primary Examiner* — Nduka E Ojeh
*Assistant Examiner* — Eric W Jones
(74) *Attorney, Agent, or Firm* — Kile Park Reed & Houtteman PLLC

(57) ABSTRACT

A display device including a lower substrate having a display region including a plurality of pixel regions, and a peripheral region surrounding the display region; a plurality of pixel structures in the plurality of pixel regions on the lower substrate; an upper substrate on the plurality of pixel structures; a seal between the lower substrate and the upper substrate in the peripheral region; and a power supply voltage wiring between the seal and the lower substrate in the peripheral region, wherein the power supply voltage wiring partially overlaps the seal, and the power supply voltage wiring includes a plurality of first openings in a
(Continued)

portion thereof that protrudes inwardly from the seal in a first direction extending from the peripheral region into the display region.

18 Claims, 24 Drawing Sheets

(52) U.S. Cl.
CPC ...... H01L 51/5234 (2013.01); H01L 51/5246 (2013.01); H01L 51/56 (2013.01); H01L 27/323 (2013.01)

(58) Field of Classification Search
USPC ...................................... 257/40, 59
See application file for complete search history.

(56) References Cited

U.S. PATENT DOCUMENTS

| | | | |
|---|---|---|---|
| 11,018,317 B2 | 5/2021 | Hong et al. | |
| 2005/0184927 A1* | 8/2005 | Kwak | H01L 27/3276 |
| | | | 345/45 |
| 2011/0134022 A1* | 6/2011 | Nakagawa | G02F 1/133512 |
| | | | 345/87 |
| 2012/0026074 A1* | 2/2012 | Lee | H01L 51/5237 |
| | | | 345/76 |
| 2012/0099061 A1* | 4/2012 | Lee | G02F 1/1339 |
| | | | 349/110 |
| 2013/0335690 A1* | 12/2013 | Fujiwara | G02F 1/133784 |
| | | | 349/153 |
| 2015/0001501 A1 | 1/2015 | Cho et al. | |
| 2015/0102295 A1* | 4/2015 | Hong | H01L 51/529 |
| | | | 257/40 |
| 2016/0013441 A1* | 1/2016 | Hong | H01L 27/3276 |
| | | | 257/40 |
| 2016/0064686 A1* | 3/2016 | Odaka | H01L 51/5246 |
| | | | 257/89 |
| 2016/0293883 A1* | 10/2016 | Hong | H01L 51/5246 |
| 2018/0076416 A1 | 3/2018 | Cho et al. | |
| 2021/0257585 A1 | 8/2021 | Hong et al. | |

FOREIGN PATENT DOCUMENTS

| | | |
|---|---|---|
| CN | 104253241 | 12/2014 |
| CN | 104851902 | 8/2015 |
| CN | 106057848 | 10/2016 |
| CN | 106356467 | 1/2017 |
| KR | 10-2015-0026441 A | 3/2015 |
| KR | 10-2016-0006861 A | 1/2016 |
| KR | 10-2016-0043226 A | 4/2016 |
| KR | 10-2016-0053242 A | 5/2016 |
| KR | 10-1772142 B1 | 8/2017 |

* cited by examiner

DISPLAY DEVICE INCLUDING A POWER SUPPLY VOLTAGE WIRING HAVING OPENINGS

CROSS-REFERENCE TO RELATED APPLICATION

Korean Patent Application No. 10-2018-0008363, filed on Jan. 23, 2018, in the Korean Intellectual Property Office, and entitled: "Display Device," is incorporated by reference herein in its entirety.

BACKGROUND

1. Field

Embodiments relate to a display device.

2. Description of the Related Art

A flat panel display (FPD) device is widely used as a display device of an electronic device because the FPD device is lightweight and thin compared to a cathode-ray tube (CRT) display device. Examples of the FPD device include a liquid crystal display (LCD) device and an organic light emitting display (OLED) device.

Upper and lower substrates may be combined using a seal. In a process for combining the upper and lower substrates, light of a laser may be irradiated in the seal. When the light of the laser is irradiated, a state of the material of the seal may be changed, such that the upper and lower substrates may be combined. A power supply voltage wiring may be disposed under the seal.

SUMMARY

The embodiments may be realized by providing a display device including a lower substrate having a display region including a plurality of pixel regions, and a peripheral region surrounding the display region; a plurality of pixel structures in the plurality of pixel regions on the lower substrate; an upper substrate on the plurality of pixel structures; a seal between the lower substrate and the upper substrate in the peripheral region; and a power supply voltage wiring between the seal and the lower substrate in the peripheral region, wherein the power supply voltage wiring partially overlaps the seal, and the power supply voltage wiring includes a plurality of first openings in a portion thereof that protrudes inwardly from the seal in a first direction extending from the peripheral region into the display region.

The first openings may be arranged along a boundary of the display region and the peripheral region in a second direction that is perpendicular to the first direction.

The power supply voltage wiring may further include a plurality of second openings in a portion thereof that overlaps the seal.

The second openings may be spaced apart from the first openings by a predetermined distance, the first openings and the second openings may be arranged in a second direction that is perpendicular to the first direction, and the first openings and the second openings may be aligned in parallel to each other.

The display device may further include a plurality of semiconductor elements between the lower substrate and the pixel structures, wherein each of the semiconductor elements includes an active layer on the lower substrate; a gate electrode on the active layer; and source and drain electrodes on the gate electrode.

The power supply voltage wiring and the source and drain electrodes may be located at a same layer.

The display device may further include a gate insulation layer on the lower substrate, the gate insulation layer covering the active layer; an insulating interlayer on the gate insulation layer, the insulating interlayer covering the gate electrode; a planarization layer on the insulating interlayer, the planarization layer covering the source and drain electrodes; and a pixel defining layer on the planarization layer.

The seal may be in contact with an upper surface of the planarization layer through the second openings.

At least a part of the power supply voltage wiring protruding inwardly from the seal may overlap and directly contact the planarization layer.

The power supply voltage wiring may further include a plurality of third openings spaced apart from the second openings by a predetermined distance, the third openings being arranged in a second direction that is perpendicular to the first direction, and the second openings and the third openings may be aligned in parallel to each other.

The display device may further include a touch wiring structure along a boundary the display region and the peripheral region on the upper substrate in the peripheral region, the touch wiring structure including a plurality of wirings.

The touch wiring structure may overlap the portion of the power supply wiring protruding inwardly from the seal.

The plurality of pixel structures may include a plurality of lower electrodes; a plurality of light emitting layers on the lower electrodes; and an upper electrode on the light emitting layers.

The upper electrode may extend from the display region into the peripheral region, and the upper electrode located in the peripheral region may be electrically connected to the power supply voltage wiring.

The display device may further include a first connection pattern between the upper electrode and the power supply voltage wiring, wherein the upper electrode and the power supply voltage wiring are electrically connected through the first connection pattern.

A first end of the first connection pattern may be in direct contact with the upper electrode, a second end of the first connection pattern may be in direct contact with power supply voltage wiring, and the first connection pattern and the plurality of lower electrodes may be located at a same layer.

The embodiments may be realized by providing a display device including a lower substrate having a display region including a plurality of pixel regions, and a peripheral region surrounding the display region; a plurality of pixel structures in the plurality of pixel regions on the lower substrate; an upper substrate on the plurality of pixel structures; a seal between the lower substrate and the upper substrate in the peripheral region; and a power supply voltage wiring between the seal and the lower substrate in the peripheral region, the power supply voltage wiring including a first wiring pattern overlapping the seal; a second wiring pattern spaced apart from the first wiring pattern in a first direction that extends inwardly from the peripheral region into the display region; and a second connection pattern under the first wiring pattern and the second wiring pattern, the second connection pattern electrically connecting the first wiring pattern and the second wiring pattern.

The display device may further include a plurality of semiconductor elements between the lower substrate and the pixel structures, wherein each of the semiconductor elements includes an active layer on the lower substrate; a gate electrode on the active layer; and source and drain electrodes on the gate electrode.

The second connection pattern and the gate electrode may be located at a same layer.

The embodiments may be realized by providing a display device including a lower substrate having a display region including a plurality of pixel regions, and a peripheral region surrounding the display region; a plurality of pixel structures in the plurality of pixel regions on the lower substrate; an upper substrate on the plurality of pixel structures; a seal between the lower substrate and the upper substrate in the peripheral region; a power supply voltage wiring between the seal and the lower substrate in the peripheral region, the power supply voltage wiring partially overlapping the seal, the power supply voltage wiring including a plurality of first openings in a portion thereof that is overlapped with the seal, and the power supply voltage wiring having a portion that protrudes inwardly from the seal in a first direction extending from the peripheral region into the display region; a touch wiring structure along a boundary between the display region and the peripheral region in the peripheral region on the upper substrate, the touch wiring structure overlapping the portion of the power supply voltage wiring that protrudes inwardly from the seal; and a blocker surrounding the touch wiring structure in the peripheral region on a lower surface of the upper substrate, the blocker overlapping a remaining portion of the power supply voltage wiring protruded from the seal.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
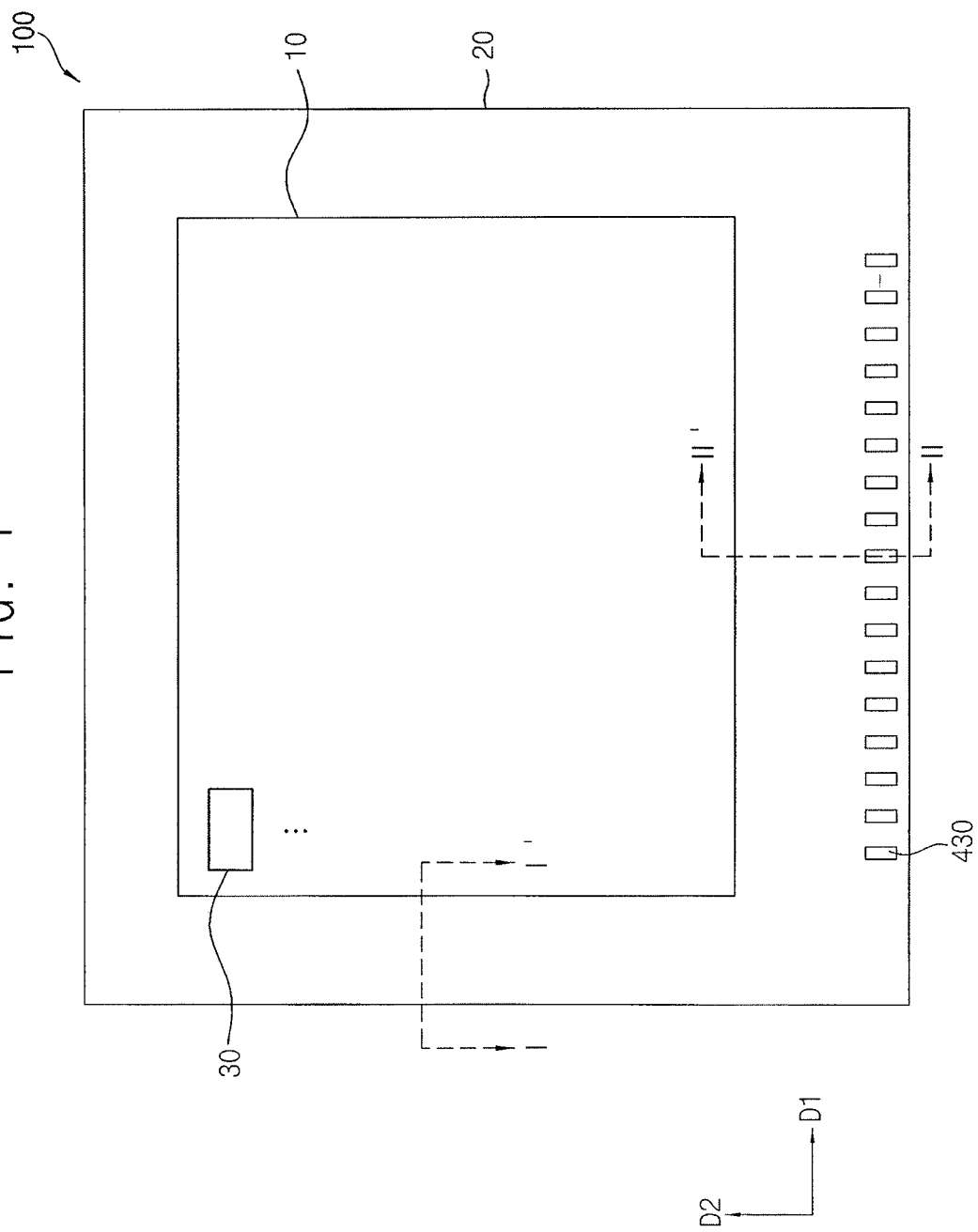
FIG. 1 illustrates a plan view of a display device in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
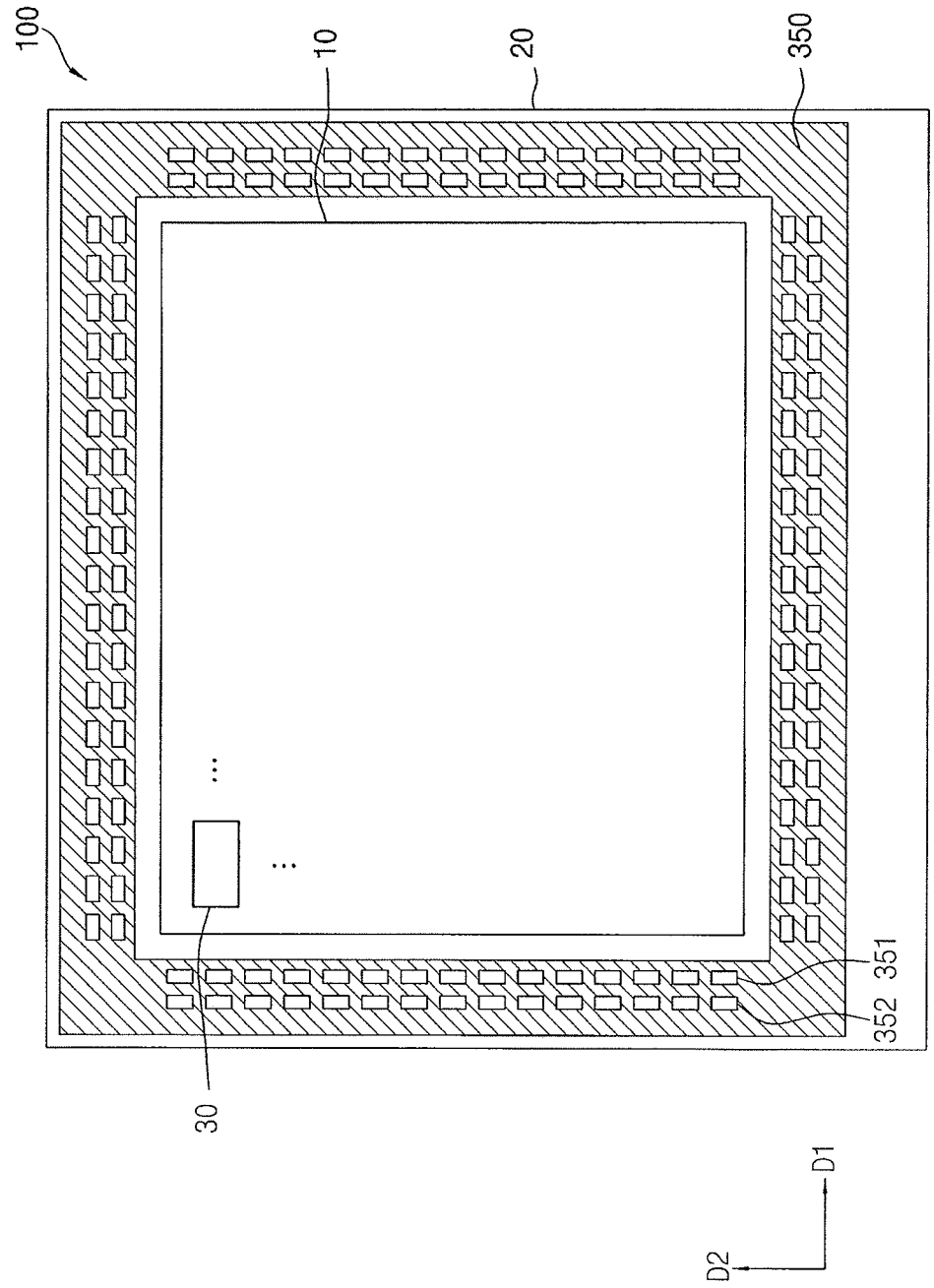
FIG. 2 illustrates a plan view of a power supply voltage wiring in the display device of FIG. 1.

FIG. 1 illustrates a plan view of a display device in accordance with example embodiments, and FIG. 2 illustrates a plan view of a power supply voltage wiring in the display device of FIG. 1.

Referring to FIGS. 1 and 2, a display device 100 may include a display region 10 and a peripheral region 20. The display region 10 may have a plurality of pixel regions 30.

A plurality of pixel structures (e.g., a pixel structure 200) may be disposed in the pixel regions 30 of the display region 10. An image (e.g., display images) may be displayed in the display region 10 through the pixel structures. Wirings (e.g., scan wirings, data wirings, power supply voltage wirings, etc.) may be disposed in the peripheral region 20. Here, the wirings may be electrically connected to the pixel structures. In an implementation, as illustrated in FIG. 1, a plurality of pad electrodes 430 may be disposed in a portion of the peripheral region 20. The pad electrodes 430 may be electrically connected to an external device. For example, the external device may be electrically connected to the display device 100 through a flexible printed circuit board, and may provide data signals, scan signals, power supply voltage, etc. to the display device 100.

In an implementation, a power supply voltage wiring 350 may be disposed in the peripheral region 20. For example, the power supply voltage wiring 350 may surround the display region 10, and may have a plan shape of a substantially athletic track (e.g., may surround a periphery of the display region 10). In addition, the power supply voltage wiring 350 may have first openings 351 and second openings 352. The first openings 351 may be located adjacent or proximate to a boundary between the display region 10 and the peripheral region 20, and may be arranged along the boundary. For example, as illustrated in FIG. 2, the first openings 351 located in top and bottom portions may be (e.g., repeatedly) arranged in a first direction D1 that is parallel to an upper surface of the display device 100, and the first openings 351 located in left and right portions may be (e.g., repeatedly) arranged in a second direction D2 that is perpendicular to the first direction D1. The second openings 352 may be spaced apart from the first openings 351, and may be arranged such that the second openings 352 surround the first openings 351 (e.g., distal to the boundary between the display region 10 and the peripheral region 20 such that the first openings 351 are between the second openings 352 and the boundary). In an implementation, the display device 100 may have the first openings 351, and an out gassing phenomenon may not occur in a planarization layer included in the display device 100.

In an implementation, a shape of each of the display region 10 and the peripheral region 20 illustrated in FIG. 1 may have a plan shape of a tetragon. In an implementation, the shape of each of the display region 10 and the peripheral region 20 may have a plan shape of a substantially triangle shape, a substantially diamond shape, a substantially polygonal shape, a substantially circular shape, a substantially athletic track shape, or a substantially elliptical shape.

Figure 3A:
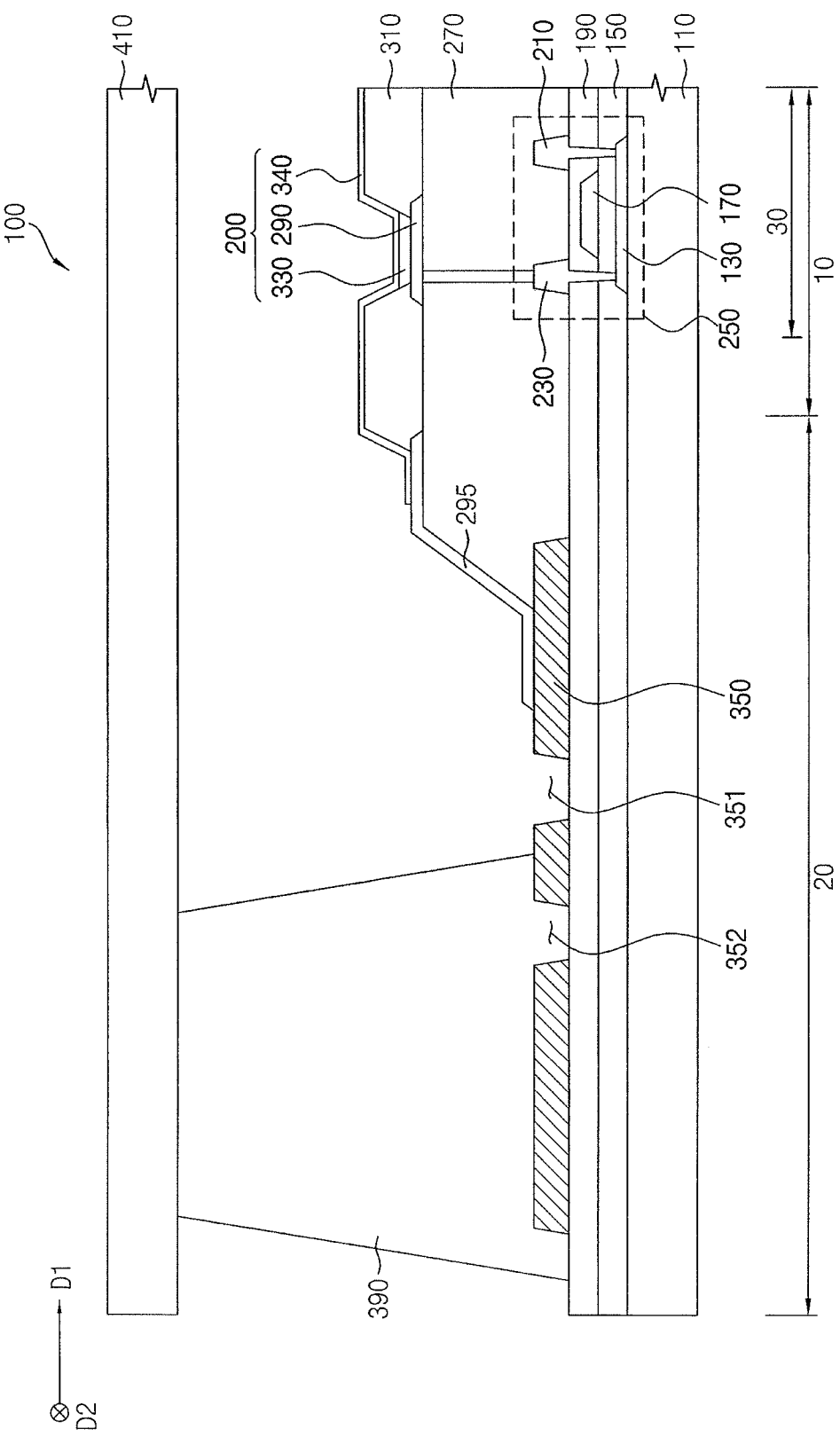
FIG. 3A illustrates a cross-sectional view taken along a line I-I' of FIG. 1.
Figure 3B:
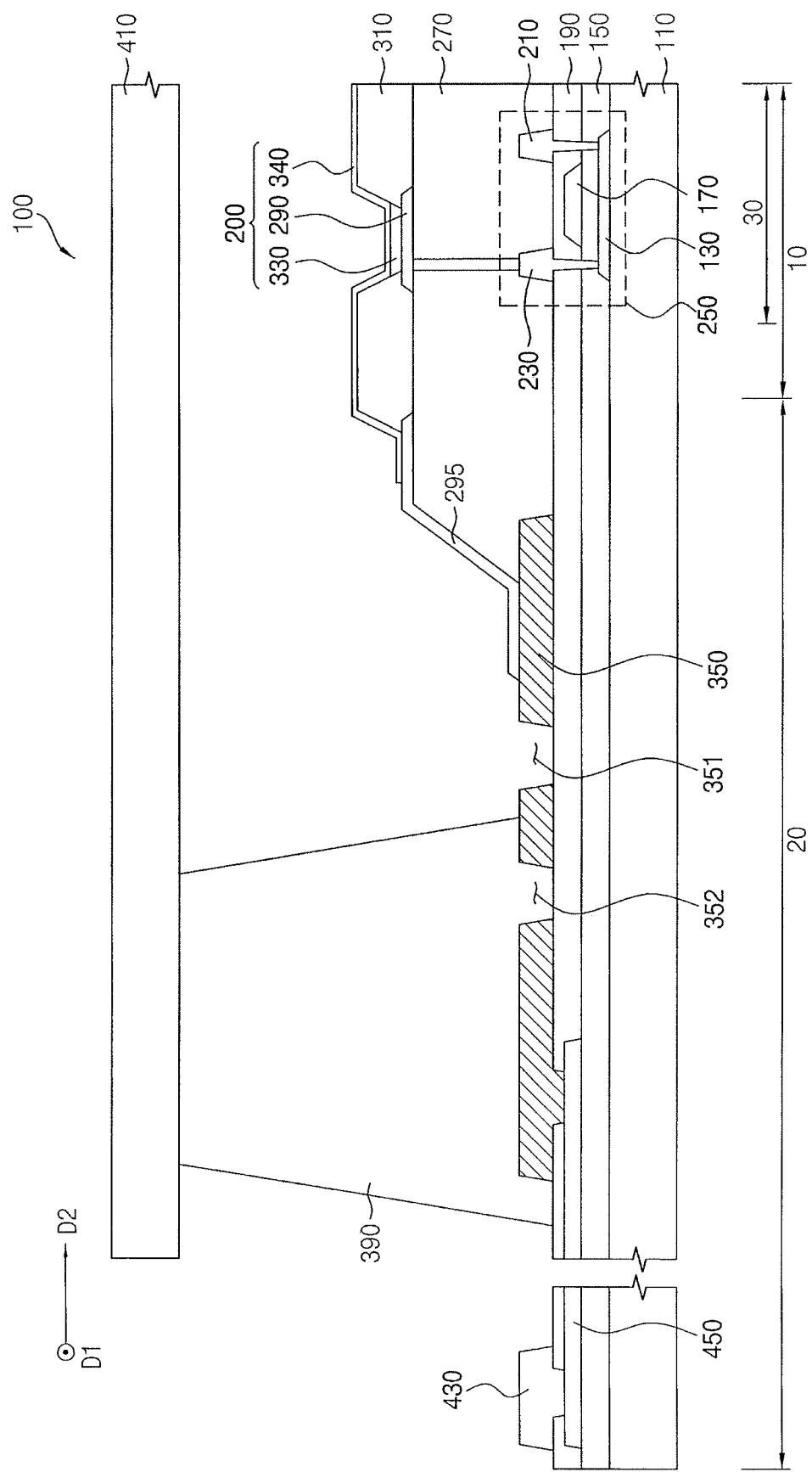
FIG. 3B illustrates a cross-sectional view taken along a line I-I' of FIG. 1.
Figure 4:
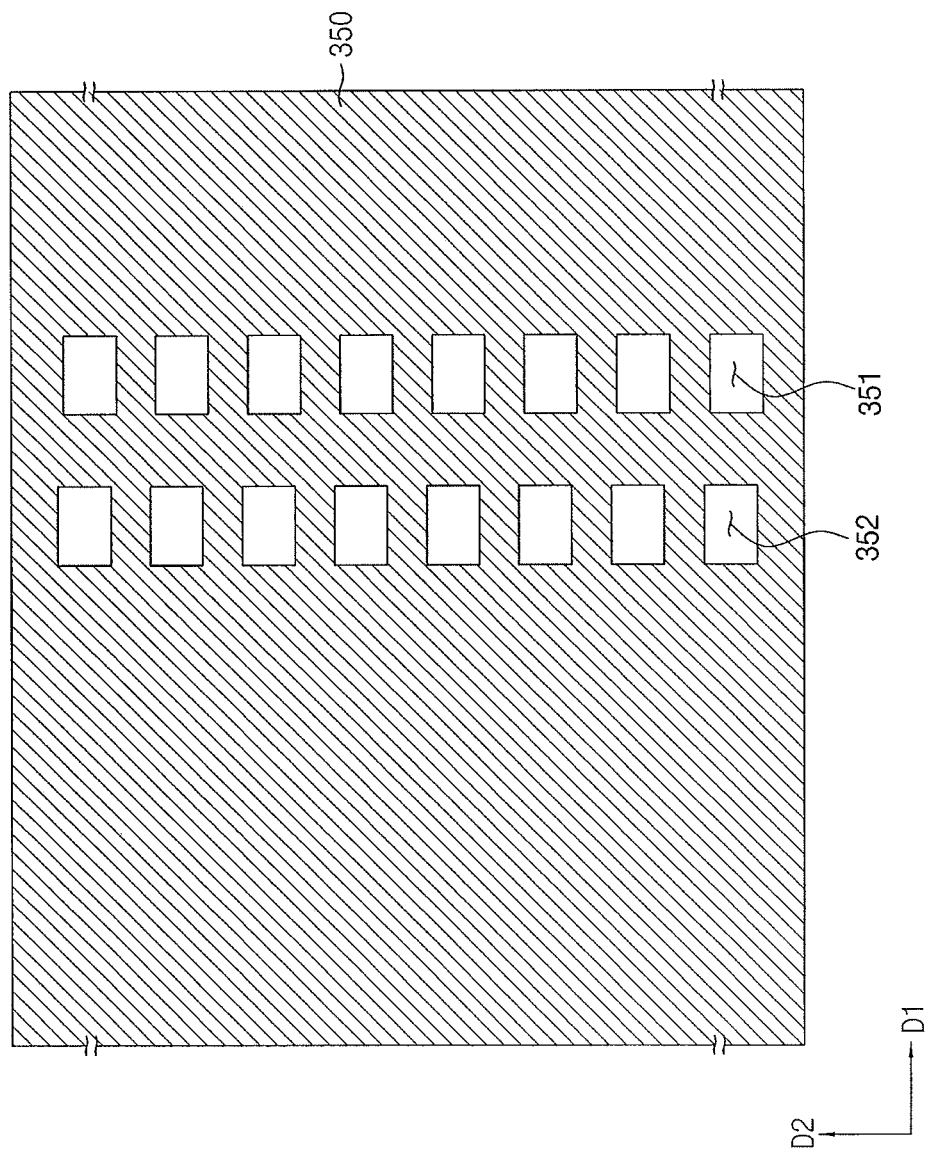
FIG. 4 illustrates a plan view of a power supply voltage wiring in the display device of FIG. 3A.

FIG. 3A illustrates a cross-sectional view taken along a line I-I' of FIG. 1, and FIG. 3B illustrates a cross-sectional view taken along a line I-I' of FIG. 1. FIG. 4 illustrates a plan view of a power supply voltage wiring of the display device of FIG. 3A.

Referring to FIGS. 3A, 3B, and 4, the display device 100 may include a lower substrate 110, a semiconductor element 250, a gate insulation layer 150, an insulating interlayer 190, a connection electrode 450, a power supply voltage wiring 350, a pad electrode 430, a planarization layer 270, a first connection pattern 295, a pixel structure 200, a pixel defining layer 310, a seal 390, an upper substrate 410, etc. In an implementation, the pixel structure 200 may include a lower electrode 290, a light emitting layer 330, and an upper electrode 340, and the semiconductor element 250 may include an active layer 130, a gate electrode 170, a source electrode 210, and a drain electrode 230.

As described above, the display device 100 may have, e.g., i) the display region 10 including the pixel regions 30 and ii) the peripheral region 20. For example, an image may be displayed through the pixel structure 200 in the display region 10, and the power supply voltage wiring 350 and the seal 390 may be disposed in the peripheral region 20.

The lower substrate 110 including transparent or opaque materials may be provided. The lower substrate 110 may include a quartz substrate, a synthetic quartz substrate, a calcium fluoride substrate, a fluoride-doped quartz substrate, a soda-lime glass substrate, a non-alkali glass substrate, etc. The display device 100 may have the display region 10, the pixel region 30, and the peripheral region 20, and the lower substrate 110 may be divided as the display region 10, the pixel region 30, and the peripheral region 20.

In an implementation, the lower substrate 110 may include a flexible transparent material such as a flexible transparent resin substrate (e.g., a polyimide substrate). In this case, the polyimide substrate may include a first polyimide layer, a barrier film layer, a second polyimide layer, etc. For example, the polyimide substrate may have a configuration where the first polyimide layer, the barrier film layer, and the second polyimide layer, are stack on the a rigid glass substrate. The polyimide substrate may be relatively thin and flexible, and the polyimide substrate may be formed on a rigid glass substrate to help support the formation of an upper structure (e.g., the semiconductor element 250 and the pixel structure 200, etc.). In a manufacturing the display device 100, after an insulation layer (e.g., a buffer layer) is provided on the second polyimide layer of the polyimide substrate, the upper structure may be formed on the buffer layer. After the upper structure is formed on the buffer layer, the rigid glass substrate on which the polyimide substrate is formed may be removed. It may be difficult to directly form the upper structure on the polyimide substrate because the polyimide substrate is relatively thin and flexible. In an implementation, the upper structure may be formed on the polyimide substrate and the rigid glass substrate, and then the polyimide substrate may serve as the lower substrate 110 after the removal of the rigid glass substrate.

A buffer layer may be disposed on the lower substrate 110. The buffer layer may be disposed on the entire lower substrate 110. The buffer layer may help prevent the diffusion of metal atoms and/or impurities from the lower substrate 110 into the semiconductor element 250 and the pixel structure 200. In addition, the buffer layer may help control a rate of a heat transfer in a crystallization process for forming the active layer 130, thereby obtaining substantially uniform the active layer 130. Further, the buffer layer may help improve a surface flatness of the lower substrate 110 when a surface of the lower substrate 110 is relatively irregular. In an implementation, according to a type of the lower substrate 110, at least two buffer layers may be provided on the lower substrate 110, or the buffer layer may be omitted. For example, the buffer layer may include organic materials or inorganic materials.

The active layer 130 may be disposed in the pixel region 30 on the lower substrate 110. For example, the active layer 130 may include an oxide semiconductor, an inorganic semiconductor (e.g., amorphous silicon, polysilicon, or the like.), an organic semiconductor, or the like.

The gate insulation layer 150 may be disposed on the active layer 130. The gate insulation layer 150 may cover the active layer 130 in the pixel region 30 on the lower substrate 110, and may be disposed on the entire lower substrate 110. In example embodiments, the gate insulation layer 150 may sufficiently cover the active layer 130 on the lower substrate 110, and may have a substantially flat upper surface without a step around the active layer 130. In an implementation, the gate insulation layer 150 may cover the active layer 130 on the lower substrate 110, and may be disposed as a substantially uniform thickness along a profile of the active layer 130. The gate insulation layer 150 may include silicon compound, metal oxide, or the like. For example, the gate insulation layer 150 may include silicon oxide ($SiO_x$), silicon nitride ($SiN_x$), silicon oxynitride ($SiO_xN_y$), silicon oxycarbide ($SiO_xC_y$), silicon carbon nitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), or the like.

The gate electrode 170 may be disposed on a portion of the gate insulation layer 150 under which the active layer 130 is located. The gate electrode 170 may include a metal, a metal alloy, metal nitride, conductive metal oxide, transparent conductive materials, or the like. These may be used alone or in a suitable combination thereof. In an implementation, the gate electrode 170 may have a multi-layered structure including a plurality of layers.

The connection electrode 450 may be disposed on a portion of the gate insulation layer 150 on which the pad electrode 430 and the power supply voltage wiring 350 are located in the peripheral region 20. The connection electrode 450 may electrically connect the pad electrode 430 and the power supply voltage wiring 350. The connection electrode 450 may include a metal, a metal alloy, metal nitride, conductive metal oxide, transparent conductive materials, or the like. These may be used alone or in a suitable combination thereof. In an implementation, the connection electrode 450 and the gate electrode 170 may be located at or on a same layer (e.g., may have coplanar surfaces), and may be simultaneously (or concurrently) formed using same materials. In an implementation, the connection electrode 450 may have a multi-layered structure including a plurality of layers.

The insulating interlayer 190 may be disposed on the gate electrode 170. The insulating interlayer 190 may cover the gate electrode 170 in the pixel region 30 on the gate insulation layer 150, and may be disposed on the entire gate insulation layer 150. In an implementation, the insulating interlayer 190 may sufficiently cover the gate electrode 170 on the gate insulation layer 150, and may have a substantially flat upper surface without a step around the gate electrode 170. In an implementation, the insulating interlayer 190 may cover the gate electrode 170 on the gate insulation layer 150, and may be disposed as a substantially uniform thickness along a profile of the gate electrode 170. The insulating interlayer 190 may include silicon compound, metal oxide, or the like.

The source electrode 210 and the drain electrode 230 may be disposed in the pixel region 30 on the insulating interlayer 190. The source electrode 210 may be in direct contact with a first side (e.g., a source region) of the active layer 130 via a contact hole formed by removing a portion of the gate insulation layer 150 and the insulating interlayer 190 each. The drain electrode 230 may be in direct contact with a second side (e.g., a drain region) of the active layer 130 via a contact hole formed by removing another portion of the gate insulation layer 150 and the insulating interlayer 190 each. The source electrode 210 and the drain electrode 230 may include a metal, an alloy, metal nitride, conductive metal oxide, transparent conductive materials, or the like. These may be used alone or in a suitable combination thereof. In an implementation, each of the source and drain electrodes 210 and 230 may have a multi-layered structure including a plurality of layers. For example, the semiconductor element 250 including the active layer 130, the gate electrode 170, the source electrode 210, and the drain electrode 230 may be constituted.

In an implementation, the display device 100 may have a configuration including one transistor (e.g., the semiconductor element 250). In an implementation, the display device 100 may have a configuration including at least two transistors and at least one capacitor.

In an implementation, the semiconductor element 250 may have a configuration including the active layer 130, the gate electrode 170, the source electrode 210, and the drain electrode 230. In an implementation, the semiconductor element 250 may have a configuration including the active layer 130, the gate insulation layer 150, the gate electrode 170, the insulating interlayer 190, the source electrode 210, and the drain electrode 230.

In an implementation, the semiconductor element 250 may have a top gate structure. In an implementation, the semiconductor element 250 may have a bottom gate structure and/or double gate structure.

The power supply voltage wiring 350 may be disposed in the peripheral region 20 on the insulating interlayer 190. For example, the power supply voltage wiring 350 may be spaced apart from the source and drain electrodes 210 and 230 on the insulating interlayer 190. In an implementation, a low power supply voltage may be applied to the power supply voltage wiring 350. The low power supply voltage may be provided to the upper electrode 340 (e.g., a high power supply voltage may be provided to the lower electrode 290).

In an implementation, the power supply voltage wiring 350 may absorb and reflect energy of light of a laser irradiated on the seal 390 so as to seal the lower substrate 110 and the upper substrate 410, and may help change a state of the material of the seal 390. For example, the power supply voltage wiring 350 may serve as a wiring capable of providing the low power supply voltage and a metal layer capable of absorbing and reflecting the energy of the light of the laser.

In an implementation, the power supply voltage wiring 350 may be disposed between the seal 390 and the lower substrate 110 in the peripheral region 20, and may partially overlap the seal 390. For example, a portion of the power supply voltage wiring 350 may be protruded from the seal 390 in the first direction D1 that a direction is from the peripheral region 20 into the display region 10, and the power supply voltage wiring 350 may have a plurality of first openings 351 in the protruded portion of the power supply voltage wiring 350 as illustrated in FIG. 4. In an implementation, another portion of the power supply voltage wiring 350 may overlap (e.g., underlie) the seal 390, and may have a plurality of second openings 352 as illustrated in FIG. 4. The first openings 351 may be located adjacent to the boundary of the display region 10 and the peripheral region 20. and may be arranged along the boundary (refer to FIG. 2). For example, the first openings 351 may be arranged (e.g., spaced apart) in the second direction D2 that is perpendicular to the first direction D1. The second openings 352 may be spaced apart from the first openings 351, and may be arranged such that the second openings 352 surround the first openings 351 (e.g., distal to the boundary).

For example, first openings may not be formed in some other power supply voltage wirings. For example, heat caused by light of a laser irradiated on the seal 390 so as to seal the lower substrate 110 and the upper substrate 410 may be transmitted to an organic layer (e.g., a planarization layer and/or a pixel defining layer) through the power supply voltage wiring. The planarization layer may be heated by the heat, and an out-gassing phenomenon where a gaseous compound having a negative charge is generated may occur. When the out-gassing phenomenon occurs, a lower electrode, a light emitting layer, and an upper electrode may be damaged.

In an implementation, the power supply voltage wiring 350 may have the first openings 351, and the display device 100 may be relatively reduced that the heat by the light of the laser is transmitted to the planarization layer 270. Accordingly, the out-gassing phenomenon may not occur in the planarization layer 270.

The power supply voltage wiring 350 may include a metal, an alloy of a metal, metal nitride, conductive metal oxide, transparent conductive materials, or the like. In an implementation, the power supply voltage wiring 350 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an alloy of aluminum, aluminum nitride (AlNx), an alloy of silver, tungsten nitride (WNx), an alloy of copper, an alloy of molybdenum, titanium nitride (TiNx), chromium nitride (CrNx), tantalum nitride (TaNx), strontium ruthenium oxide (SRO), zinc oxide (ZnOx), indium tin oxide (ITO), tin oxide (SnOx), indium oxide (InOx), gallium oxide (GaOx), indium zinc oxide (IZO), or the like. These may be used alone or in a suitable combination thereof. In an implementation, the power supply voltage wiring 350 may have a multi-layered structure including a plurality of layers.

As illustrated in FIG. 3B, the pad electrode 430 may be spaced apart from the seal 390 in the peripheral region 20 on the insulating interlayer 190. For example, the pad electrode 430 may be spaced apart from the seal 390, and may be disposed at an outermost portion of the lower substrate 110. An external device may provide the low power supply voltage to the pad electrode 430, and the low power supply voltage may be provided to the power supply voltage wiring 350 through the connection electrode 450. The pad electrode 430 may include a metal, an alloy of a metal, metal nitride, conductive metal oxide, transparent conductive materials, or the like. These may be used alone or in a suitable combination thereof. In an implementation, the pad electrode 430, the power supply voltage wiring 350, the source electrode 210, and the drain electrode 230 may be located at or on a same layer, and may be simultaneously formed using same materials. In an implementation, the pad electrode 430 may have a multi-layered structure including a plurality of layers.

The planarization layer 270 may be disposed on the insulating interlayer 190, the source electrode 210, the drain electrode 230, and a portion of the power supply voltage wiring 350. In an implementation, at least a portion of the power supply voltage wiring 350 protruded from the seal 390 may overlap (e.g., underlie) the planarization layer 270, and may be in direct contact with the planarization layer 270. For example, the planarization layer 270 may have a thickness sufficient to cover the source and drain electrodes 210 and 230 and the power supply voltage wiring 350. For example, the planarization layer 270 may have a substantially flat upper surface, and a planarization process may be further performed on the planarization layer 270 to implement the flat upper surface of the planarization layer 270. A portion of an upper surface of the drain electrode 230 may be exposed through a contact hole formed by removing a portion of the planarization layer 270. The planarization layer 270 may include organic materials or inorganic materials. In an implementation, the planarization layer 270 may include organic materials. For example, the planarization layer 270 may include a polyimide resin, a photoresist, an acryl resin, a polyamide resin, a siloxane resin, or the like.

The lower electrode 290 may be disposed in the pixel region 30 on the planarization layer 270. The lower electrode 290 may be in contact with the drain electrode 230 via the contact hole of the planarization layer 270. In an implementation, the lower electrode 290 may be electrically connected to the semiconductor element 250. The lower electrode 290 may include a metal, a metal alloy, metal nitride, conductive metal oxide, transparent conductive materials, or the like. These may be used alone or in a suitable combination thereof. In an implementation, the lower electrode 290 may have a multi-layered structure including a plurality of layers.

The first connection pattern 295 may be disposed in the peripheral region 20 on a portion of the power supply voltage wiring 350 and a portion of the planarization layer 270. In an implementation, the first connection pattern 295 may be in direct contact with an upper surface of the planarization layer 270, a side wall of the planarization layer 270, and a portion of an upper surface of the portion of the power supply voltage wiring 350 protruded from the seal 390 in the peripheral region 20. For example, a first side or end of the first connection pattern 295 may be in direct contact with the upper electrode 340, and a second side or end of the first connection pattern 295 may be in direct contact with the power supply voltage wiring 350. The first connection pattern 295 may electrically connect the power supply voltage wiring 350 and the upper electrode 340. The first connection pattern 295 may include a metal, a metal alloy, metal nitride, conductive metal oxide, transparent conductive materials, or the like. These may be used alone or in a suitable combination thereof. In an implementation, the lower electrode 290 and the first connection pattern 295 may be located at or on a same layer, and may be simultaneously formed using same materials. In an implementation, the first connection pattern 295 may have a multi-layered structure including a plurality of layers.

The pixel defining layer 310 may be disposed on a portion of the lower electrode 290, a portion of the first connection pattern 295, and the planarization layer 270. The pixel defining layer 310 may cover both lateral portions of the lower electrode 290 and a lateral portion of the first connection pattern 295, and may expose a portion of an upper surface of the lower electrode 290. The pixel defining layer 310 may include organic materials or inorganic materials. In an implementation, the pixel defining layer 310 may include organic materials.

The light emitting layer 330 may be disposed on the lower electrode 290 exposed by the pixel defining layer 310. The light emitting layer 330 may be formed using at least one of light emitting materials capable of generating different colors of light (e.g., a red color of light, a blue color of light, and a green color of light) according to sub-pixels. In an implementation, the light emitting layer 330 may generally generate a white color of light by stacking a plurality of light emitting materials capable of generating different colors of light such as a red color of light, a green color of light, and a blue color of light. In this case, a color filter may be disposed on the light emitting layer 330 (e.g., the color filter overlaps the light emitting layer 330, and is disposed on lower or upper surfaces of the upper substrate 410). The color filter may include at least one selected from a red color filter, a green color filter, and a blue color filter. In an implementation, the color filter may include a yellow color filter, a cyan color filter, and a magenta color filter. The color filter may include a photosensitive resin.

The upper electrode 340 may be disposed on a portion of the first connection pattern 295, the pixel defining layer 310, and the light emitting layer 330. In an implementation, the upper electrode 340 may cover the light emitting layer 330 and the pixel defining layer 310, and may extend from the display region 10 into the peripheral region 20. In an implementation, the upper electrode 340 located in the peripheral region 20 may be in direct contact with a portion of an upper surface of the first connection pattern 295, and may be electrically connected to the first connection pattern 295. The upper electrode 340 may include a metal, a metal alloy, metal nitride, conductive metal oxide, transparent conductive materials, or the like. These may be used alone or in a suitable combination thereof. In an implementation, the upper electrode 340 may have a multi-layered structure including a plurality of layers. Accordingly, the pixel structure 200 including the lower electrode 290, the light emitting layer 330, and the upper electrode 340 may be constituted.

The seal 390 may be disposed in the peripheral region 20 on the power supply voltage wiring 350. For example, the seal 390 may be disposed between the lower substrate 110 and the upper substrate 410 in the peripheral region 20. An upper surface of the seal 390 may be in direct contact with a lower surface of the upper substrate 410, and a lower surface of the seal 390 may be in direct contact with a portion of the insulating interlayer 190 and a portion of the power supply voltage wiring 350. In an implementation, the seal 390 may be in contact with an upper surface of the insulating interlayer 190 through the second openings 352.

The seal 390 may include frit or the like. In an implementation, the seal 390 may additionally include a photo curable material. For example, the seal 390 may include a compound such as the organic material and the photo curable material. In an implementation, after ultraviolet ray, laser beam, visible ray, etc. are irradiated in the compound, the compound may be cured, and thus the seal 390 may be obtained. The photo curable material included in the seal 390 may include an epoxy acrylate resin, a polyester acrylate resin, a urethane acrylate resin, a polybutadiene acrylate resin, a silicon acrylate resin, an alkyl acrylate resin, or the like.

For example, a laser may be irradiated in the compound such as the organic material and the photo curable material. According to an irradiation of the light of the laser, a state of the compound (e.g., the seal 390) may be changed from a solid state to a liquid state. In addition, the compound of the liquid state may be cured to the solid state after a predetermined time. In accordance with the state change of the compound, the compound may seal the lower substrate 110 and the upper substrate 410. The power supply voltage wiring 350 may absorb or reflect energy of light of the laser while the light of the laser is irradiated. The energy absorbed and reflected by the power supply voltage wiring 350 may be transmitted to the compound, and may help change a state of the material of the compound.

In an implementation, the seal 390 may have a trapezoidal shape where a width of an upper surface is less than a width of a lower surface. In an implementation, the seal 390 may have a trapezoidal shape where a width of an upper surface is greater than a width of a lower surface, a tetragonal shape, a quadrate shape, or the like.

The upper substrate 410 may be disposed on the seal 390 and the upper electrode 340 (e.g., may face the upper electrode 340). The upper substrate 410 and the lower substrate 110 may include substantially same materials. In an implementation, the upper substrate 410 may include a quartz substrate, a synthetic quartz substrate, a calcium fluoride substrate, a fluoride-doped quartz substrate, a soda-lime glass substrate, a non-alkali glass substrate, etc. In an implementation, the upper substrate 410 may include a transparent inorganic material or flexible plastic. For example, the upper substrate 410 may include a flexible transparent resin substrate. In this case, to increase flexibility of the display device 100, the upper substrate 410 may have a stacked structure where at least one inorganic layer and at least one organic layer are alternately stacked. Accordingly, the display device 100 may be constituted.

The display device 100 in accordance with example embodiments may include the power supply voltage wiring 350 having the first openings 351 and the second openings 352, and heat (caused by light of a laser) transmitted to the planarization layer 270 may be reduced. Accordingly, an out-gassing phenomenon may not occur (or may otherwise be reduced) in the planarization layer 270.

In addition, the power supply voltage wiring 350 may serve as a wiring capable of providing a low power supply voltage and a metal layer capable of absorbing and reflecting the energy of the light of the laser. Accordingly, as a metal layer capable of absorbing and reflecting the energy of the light of the laser is not disposed, a manufacturing cost of the display device 100 may be relatively reduced.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Experimental Example: Evaluation on Temperature of Organic Layer According to Presence or Absence of Opening of Power Supply Voltage Wiring A power supply voltage wiring without first openings, a seal disposed on the power supply voltage wiring, and an upper substrate disposed on the seal were sequentially formed on a lower substrate to obtain stacked structures of a Comparative Example.

Meanwhile, a power supply voltage wiring 350 having the first openings 351, the seal 390 disposed on the power supply voltage wiring 350, and the upper substrate 410 disposed on the seal 390 were sequentially formed on the lower substrate 110 to obtain a stacked structure of an Example.

Stack structures of Comparative Example and Example are shown in Table 1 below.

TABLE 1

|  | Temperature of Seal (° C.) | | | Temperature of Organic Layer (° C.) (Planarization Layer) | | | Power Consumption |
|---|---|---|---|---|---|---|---|
|  | | | | | | Deviation | Increase |
|  | Left | Center | Right | Left | Right | (Left/Right) | — |
| Comparative Example (seal/power supply voltage wiring without first openings) | 322 | 545 | 381 | 298 | 122 | — | — |
| Example (seal/power supply voltage wiring having first openings) | 323 | 547 | 398 | 208 | 99 | −90/−23 | 0.52% |

Light was irradiated over the seal of the Comparative Example and Example, and temperatures were measured in left, center, and right of the seal and in left and right of the organic layer. For example, the left of the seal was an outermost portion of the display device, the right of the seal was a portion that is adjacent to the organic layer. The center of the seal was between the left and the right. In addition, the left of the organic layer was a portion where the organic layer is located in the peripheral region 20, and the right of the organic layer was a portion where the organic layer is located in the display region 10.

As shown in Table 1, when the first openings 351 are formed in the power supply voltage wiring 350 (e.g., the Example), a relatively low temperature may be measured in the left and the right of the organic layer compared to those measured in Comparative Example, including the power supply voltage wiring without the first openings. Accordingly, although the light of the laser was irradiated on the seal in a process for sealing the lower substrate and the upper substrate, an out-gassing phenomenon capable of being generated in the organic layer may be relatively reduced.

FIGS. 5 through 10 illustrate cross-sectional views of stages in a method of manufacturing a display device in accordance with example embodiments.

Figure 5:
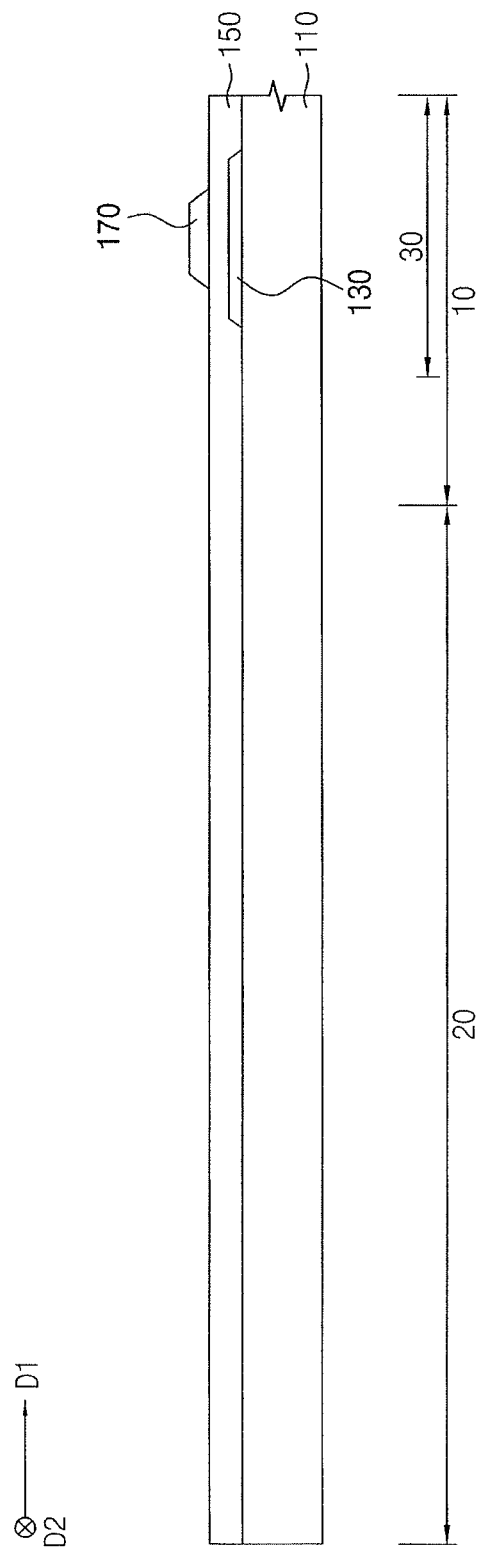
FIGS. 5 through 10 illustrate cross-sectional views of stages in a method of manufacturing a display device in accordance with example embodiments.

Referring to FIG. 5, a lower substrate 110 including transparent or opaque materials may be provided. The lower substrate 110 may be formed using a quartz substrate, a synthetic quartz substrate, a calcium fluoride substrate, a fluoride-doped quartz substrate, a soda-lime glass substrate, a non-alkali glass substrate, or the like. The lower substrate 110 may be divided as a display region 10, a pixel region 30, and a peripheral region 20. In an implementation, the lower substrate 110 may be formed using a flexible transparent material such as a flexible transparent resin substrate (e.g., a polyimide substrate).

In an implementation, a buffer layer may be formed on the lower substrate 110. The buffer layer may be formed on the entire lower substrate 110. The buffer layer may help prevent the diffusion of metal atoms and/or impurities from the lower substrate 110. In addition, the buffer layer may help control a rate of a heat transfer in a crystallization process for forming an active layer, thereby obtaining substantially uniform the active layer. In an implementation, the buffer layer may help improve a surface flatness of the lower substrate 110 when a surface of the lower substrate 110 is relatively irregular. According to a type of the lower substrate 110, at least two buffer layers may be provided on the lower substrate 110, or the buffer layer may not be disposed. For example, the buffer layer may be formed using organic materials or inorganic materials.

An active layer 130 may be formed in the pixel region 30 on the lower substrate 110. For example, the active layer 130 may be formed using an oxide semiconductor, an inorganic semiconductor (e.g., amorphous silicon, polysilicon, or the like.), an organic semiconductor, or the like.

A gate insulation layer 150 may be formed on the active layer 130. The gate insulation layer 150 may cover the active layer 130 in the pixel region 30 on the lower substrate 110, and may be formed on the entire lower substrate 110. In an implementation, the gate insulation layer 150 may sufficiently cover the active layer 130 on the lower substrate 110, and may have a substantially flat upper surface without a step around the active layer 130. In an implementation, the gate insulation layer 150 may cover the active layer 130 on the lower substrate 110, and may be formed as a substantially uniform thickness along a profile of the active layer 130. The gate insulation layer 150 may be formed using silicon compound, metal oxide, or the like. For example, the gate insulation layer 150 may include $SiO_x$, $SiN_x$, $SiO_xN_y$, $SiO_xC_y$, $SiC_xN_y$, $AlO_x$, $AlN_x$, $TaO_x$, $HfO_x$, $ZrO_x$, $TiO_x$, or the like.

A gate electrode 170 may be formed on a portion of the gate insulation layer 150 under which the active layer 130 is located. The gate electrode 170 may be formed using a metal, a metal alloy, metal nitride, conductive metal oxide, transparent conductive materials, or the like. These may be used alone or in a suitable combination thereof. In an implementation, the gate electrode 170 may have a multi-layered structure including a plurality of layers.

Figure 6:
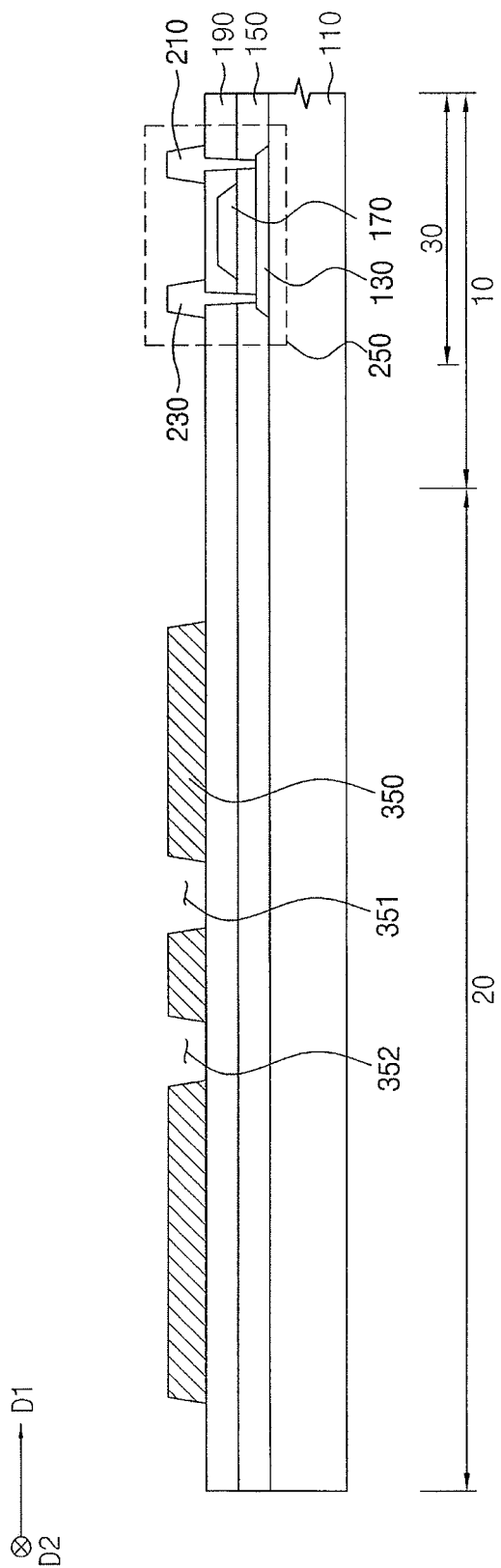
Figure 7:
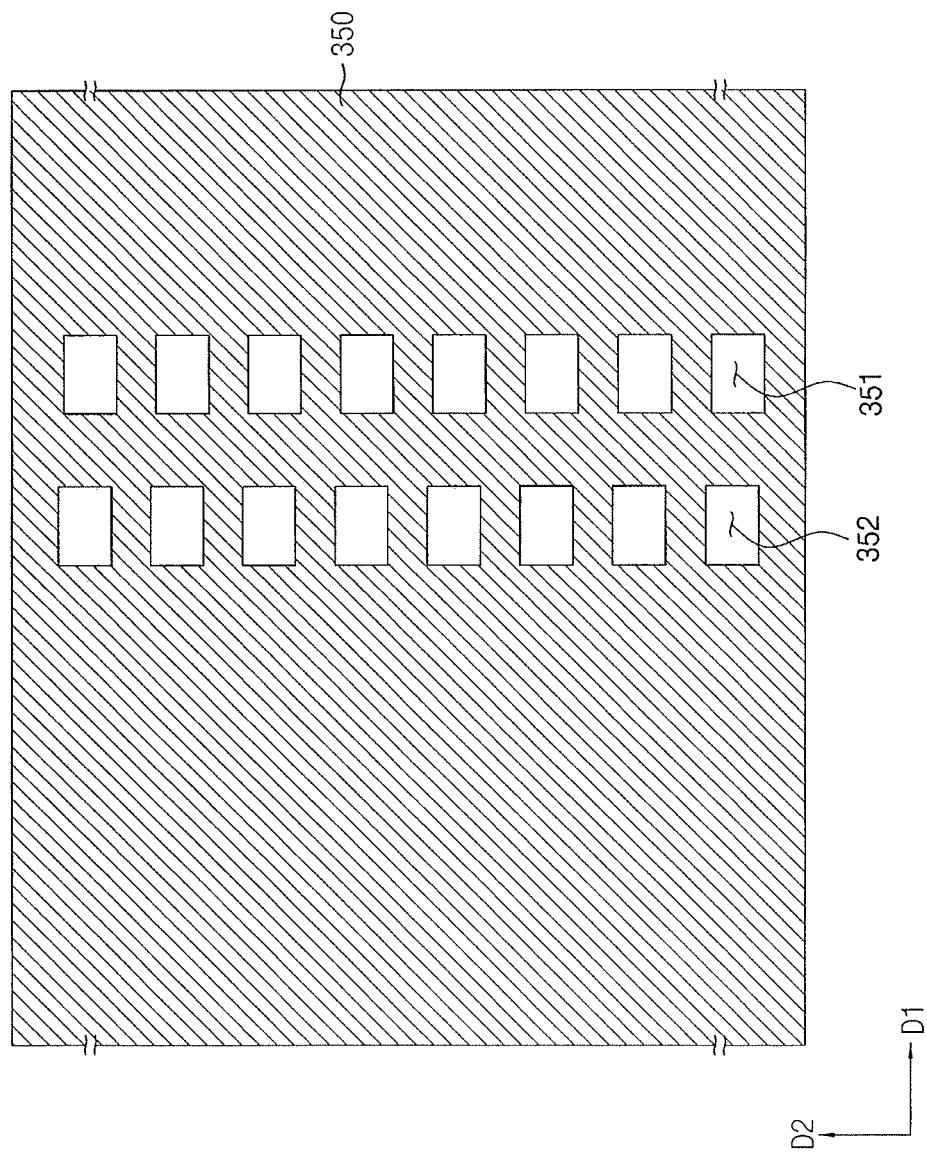

Referring to FIGS. 6 and 7, an insulating interlayer 190 may be formed on the gate electrode 170. The insulating interlayer 190 may cover the gate electrode 170 in the pixel region 30 on the gate insulation layer 150, and may be formed on the entire gate insulation layer 150. In an implementation, the insulating interlayer 190 may sufficiently cover the gate electrode 170 on the gate insulation layer 150, and may have a substantially flat upper surface without a step around the gate electrode 170. In an implementation, the insulating interlayer 190 may cover the gate electrode 170 on the gate insulation layer 150, and may be formed as a substantially uniform thickness along a profile of the gate electrode 170. The insulating interlayer 190 may be formed using silicon compound, metal oxide, or the like.

A source electrode 210 and a drain electrode 230 may be formed in the pixel region 30 on the insulating interlayer 190. The source electrode 210 may be in direct contact with a first side (e.g., a source region) of the active layer 130 via a contact hole formed by removing a portion of each of the gate insulation layer 150 and the insulating interlayer 190. The drain electrode 230 may be in direct contact with a second side (e.g., a drain region) of the active layer 130 via a contact hole formed by removing another portion of each of the gate insulation layer 150 and the insulating interlayer 190. The source electrode 210 and the drain electrode 230 may be formed using a metal, an alloy, metal nitride, conductive metal oxide, transparent conductive materials, or the like. These may be used alone or in a suitable combination thereof. In an implementation, each of the source and drain electrodes 210 and 230 may have a multi-layered structure including a plurality of layers. Accordingly, a semiconductor element 250 including the active layer 130, the gate electrode 170, the source electrode 210, and the drain electrode 230 may be formed.

A power supply voltage wiring 350 may be formed in the peripheral region 20 on the insulating interlayer 190. For example, the power supply voltage wiring 350 may be spaced apart from the source and drain electrodes 210 and 230 on the insulating interlayer 190. In an implementation, the power supply voltage wiring 350 may serve as a wiring capable of providing a low power supply voltage and a metal layer capable of absorbing and reflecting the energy of light of a laser.

In addition, a portion of the power supply voltage wiring 350 may be protruded from a seal, which will be described below, in a first direction D1 (e.g., a direction is from the peripheral region 20 into the display region 10), and the power supply voltage wiring 350 may have a plurality of first openings 351 in the protruded portion of the power supply voltage wiring 350. In addition, another portion of the power supply voltage wiring 350 may overlap (e.g., underlie) the seal, and may have a plurality of second openings 352. The first openings 351 may be located adjacent to a boundary of the display region 10 and the peripheral region 20, and may be arranged along the boundary (refer to FIG. 2). For example, the first openings 351 may be arranged (e.g., spaced apart) in a second direction D2 that is perpendicular to the first direction D1, as illustrated in FIG. 7. The second openings 352 may be spaced apart from the first openings 351, and may be arranged such that the second openings 352 surround the first openings 351 (e.g., the second openings 352 may be aligned with the first openings 351 at an outer side of the first openings 351).

The power supply voltage wiring 350 may be formed using a metal, an alloy of a metal, metal nitride, conductive metal oxide, transparent conductive materials, or the like. For example, the power supply voltage wiring 350 may include Au, Ag, Al, Pt, Ni, Ti, Pd, Mg, Ca, Li, Cr, Ta, W, Cu, Mo, Sc, Nd, Ir, an alloy of aluminum, AlNx, an alloy of silver, WNx, an alloy of copper, an alloy of molybdenum, TiNx, chromium nitride (CrNx), tantalum nitride (TaNx), strontium ruthenium oxide (SRO), zinc oxide (ZnOx), indium tin oxide (ITO), tin oxide (SnOx), indium oxide (InOx), gallium oxide (GaOx), indium zinc oxide (IZO), or the like. These may be used alone or in a suitable combination thereof.

In an implementation, the power supply voltage wiring 350, the source electrode 210, and the drain electrode 230 may be located at a same layer, and may be simultaneously formed using same materials. For example, a preliminary first electrode layer may be formed on the entire insulating interlayer 190, the power supply voltage wiring 350, the source electrode 210, and the drain electrode 230 may be formed by selectively etching the preliminary first electrode layer. In an implementation, the power supply voltage wiring 350 may have a multi-layered structure including a plurality of layers.

Figure 8:
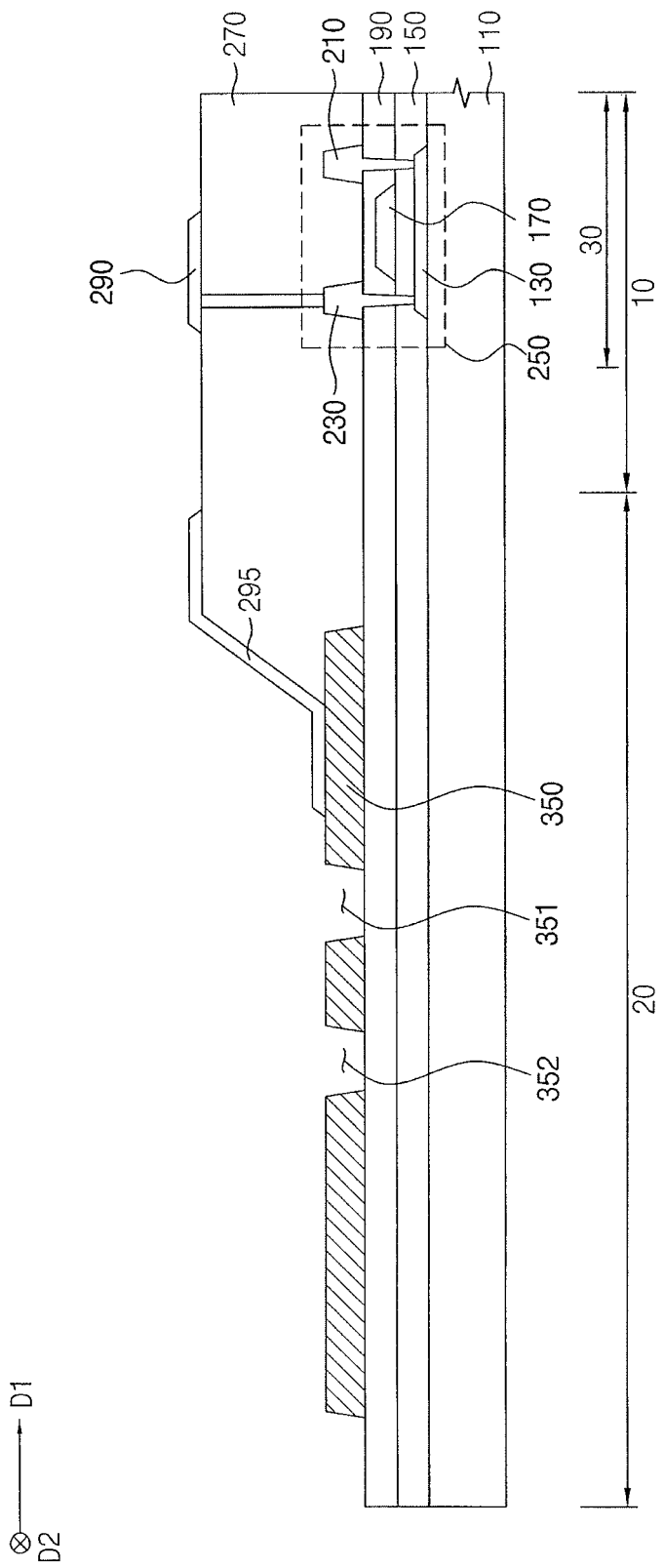

Referring to FIG. 8, a planarization layer 270 may be formed on the insulating interlayer 190, the source electrode 210, the drain electrode 230, and a portion of the power supply voltage wiring 350. In an implementation, at least a portion of the power supply voltage wiring 350 protruded from the seal may overlap the planarization layer 270, and may be in direct contact with the planarization layer 270. For example, the planarization layer 270 may a thickness that is sufficient to cover the source and drain electrodes 210 and 230 and the power supply voltage wiring 350. In this case, the planarization layer 270 may have a substantially flat upper surface, and a planarization process may be further performed on the planarization layer 270 to implement the flat upper surface of the planarization layer 270. A portion of an upper surface of the drain electrode 230 may be exposed through a contact hole formed by removing a portion of the planarization layer 270. The planarization layer 270 may include organic materials or inorganic materials. In an implementation, the planarization layer 270 may be formed using organic materials. For example, the planarization layer 270 may include a polyimide resin, a photoresist, an acryl resin, a polyamide resin, a siloxane resin, or the like.

A lower electrode 290 may be formed in the pixel region 30 on the planarization layer 270. The lower electrode 290 may be in contact with the drain electrode 230 via the contact hole of the planarization layer 270. In addition, the lower electrode 290 may be electrically connected to the semiconductor element 250. The lower electrode 290 may be formed using a metal, a metal alloy, metal nitride, conductive metal oxide, transparent conductive materials, or the like. These may be used alone or in a suitable combination thereof. In an implementation, the lower electrode 290 may have a multi-layered structure including a plurality of layers.

A first connection pattern 295 may be formed in the peripheral region 20 on a portion of the power supply voltage wiring 350 and a portion of the planarization layer 270. In an implementation, the first connection pattern 295 may be in direct contact with an upper surface of the planarization layer 270, a side wall of the planarization layer 270, and a portion of an upper surface of the portion of the power supply voltage wiring 350 protruded from the seal 390 in the peripheral region 20. The first connection pattern 295 may be formed using a metal, a metal alloy, metal nitride, conductive metal oxide, transparent conductive materials, or the like. These may be used alone or in a suitable combination thereof. In an implementation, the lower electrode 290 and the first connection pattern 295 may be located at a same layer, and may be simultaneously formed using same materials. For example, a preliminary second electrode layer may be formed on the insulating interlayer 190, the power supply voltage wiring 350, and the planarization layer 270, and the first connection pattern 295 and the lower electrode 290 may be formed by selectively etching the preliminary second electrode layer. In an implementation, the first connection pattern 295 may have a multi-layered structure including a plurality of layers.

Figure 9:
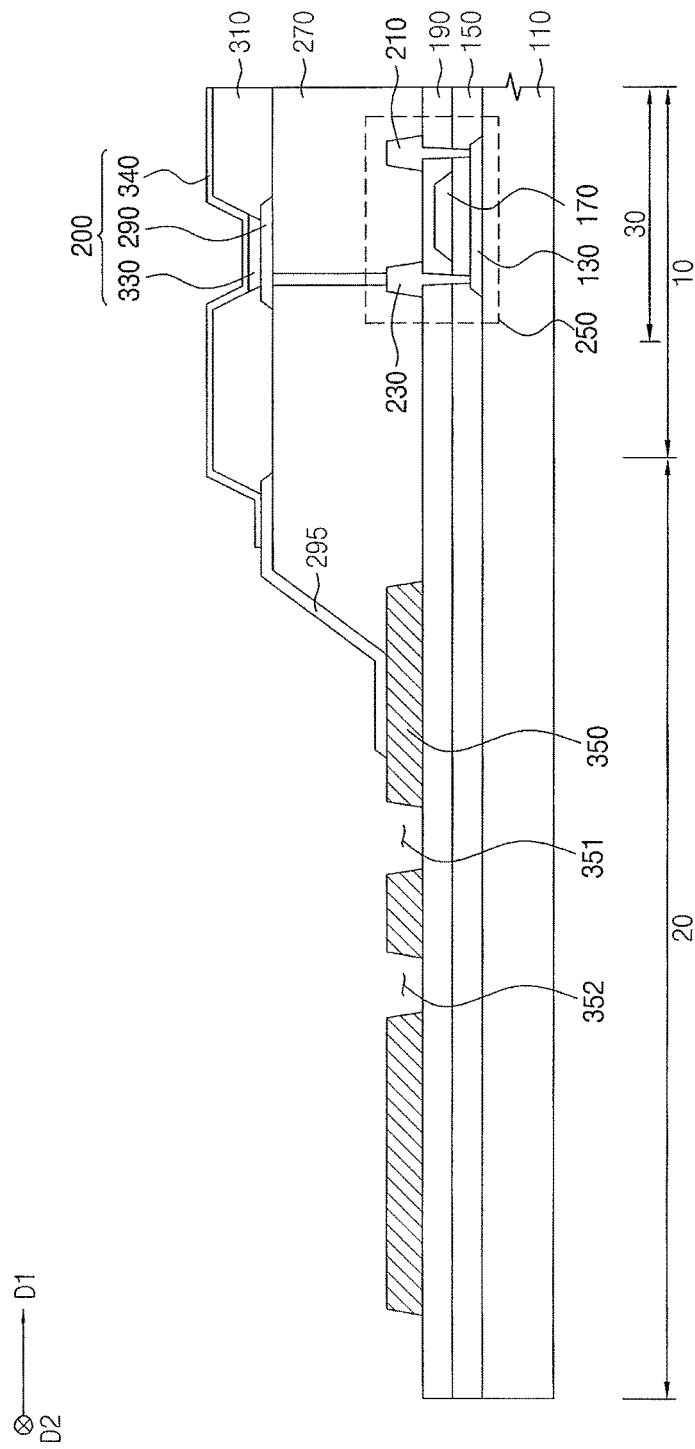

Referring to FIG. 9, a pixel defining layer 310 may be disposed on a portion of the lower electrode 290, a portion of the first connection pattern 295, and the planarization layer 270. The pixel defining layer 310 may cover both lateral portions of the lower electrode 290 and a lateral portion of the first connection pattern 295, and may expose a portion of an upper surface of the lower electrode 290. The pixel defining layer 310 may include organic materials or inorganic materials. In an implementation, the pixel defining layer 310 may be formed using organic materials.

A light emitting layer 330 may be formed on the lower electrode 290 exposed by the pixel defining layer 310. The light emitting layer 330 may be formed using at least one of light emitting materials capable of generating different colors of light (e.g., a red color of light, a blue color of light, and a green color of light) according to sub-pixels. In an implementation, the light emitting layer 330 may generally generate a white color of light by stacking a plurality of light emitting materials capable of generating different colors of light such as a red color of light, a green color of light, and a blue color of light. In this case, a color filter may be formed on the light emitting layer 330. The color filter may include at least one selected from a red color filter, a green color filter, and a blue color filter. In an implementation, the color filter may include a yellow color filter, a cyan color filter, and a magenta color filter. The color filter may be formed using a photosensitive resin.

An upper electrode 340 may be formed on a portion of the first connection pattern 295, the pixel defining layer 310, and the light emitting layer 330. In an implementation, the upper electrode 340 may cover the light emitting layer 330 and the pixel defining layer 310, and may extend from the display region 10 into the peripheral region 20. In an implementation, the upper electrode 340 located in the peripheral region 20 may be in direct contact with a portion of an upper surface of the first connection pattern 295, and may be electrically connected to the first connection pattern 295. The upper electrode 340 may be formed using a metal, a metal alloy, metal nitride, conductive metal oxide, transparent conductive materials, or the like. These may be used alone or in a suitable combination thereof. In an implementation, the upper electrode 340 may have a multi-layered structure including a plurality of layers. Accordingly, a pixel structure 200 including the lower electrode 290, the light emitting layer 330, and the upper electrode 340 may be formed.

Figure 10:
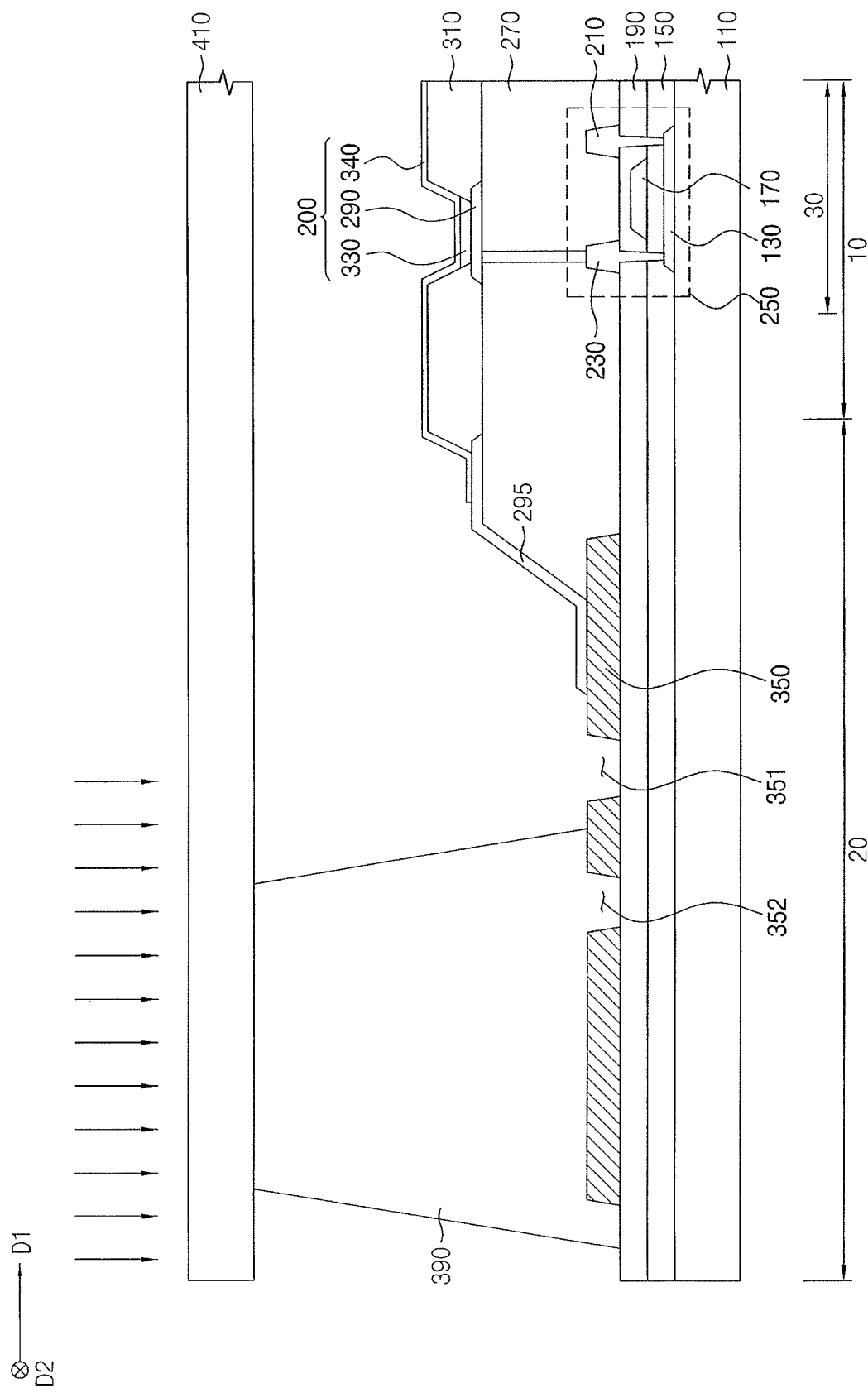

Referring to FIG. 10, a seal 390 may be formed in the peripheral region 20 on the power supply voltage wiring 350, and a lower surface of the seal 390 may be in direct contact with a portion of the insulating interlayer 190 and a portion of the power supply voltage wiring 350. In an implementation, the seal 390 may be in contact with an upper surface of the insulating interlayer 190 through the second openings 352. The seal 390 may be formed using frit or the like. In an implementation, the seal 390 may additionally include a photo curable material. For example, the seal 390 may include a compound such as the organic material and the photo curable material. In an implementation, after ultraviolet ray, laser beam, visible ray, or the like are irradiated in the compound, the compound may be cured, and thus the seal 390 may be obtained. The photo curable material included in the seal 390 may be formed using an epoxy acrylate resin, a polyester acrylate resin, a urethane acrylate resin, a polybutadiene acrylate resin, a silicon acrylate resin, an alkyl acrylate resin, etc.

An upper substrate 410 may be formed on the seal 390 and facing the upper electrode 340. The upper substrate 410 and the lower substrate 110 may include substantially same materials. For example, the upper substrate 410 may be formed using a quartz substrate, a synthetic quartz substrate, a calcium fluoride substrate, a fluoride-doped quartz substrate, a soda-lime glass substrate, a non-alkali glass substrate, or the like. In an implementation, the upper substrate 410 may include a transparent inorganic material or flexible plastic. For example, the upper substrate 410 may include a flexible transparent resin substrate. In this case, to increase flexibility of the display device 100, the upper substrate 410 may have a stacked structure where at least one inorganic layer and at least one organic layer are alternately stacked.

After the upper substrate 410 is formed, light of a laser may be irradiated on the seal 390. According to an irradiation of the light of the laser, a state of the compound (e.g., the seal 390) may be changed from a solid state to a liquid state. In addition, the compound of the liquid state may be cured to the solid state after a predetermined time. In accordance with the state change of the compound, the compound may seal the lower substrate 110 and the upper substrate 410. The power supply voltage wiring 350 may absorb or reflect energy of the light of the laser while the light of the laser is irradiated. The energy absorbed and reflected by the power supply voltage wiring 350 may be transmitted to the compound, and may help change a state of the material of the compound.

In an implementation, as the power supply voltage wiring 350 includes the first openings 351, heat caused by the light of a laser and transmitted to the planarization layer 270 may be reduced. Accordingly, an out-gassing phenomenon may not occur in the planarization layer 270. Accordingly, a display device 100 illustrated in FIG. 3A may be manufactured.

Figure 11:
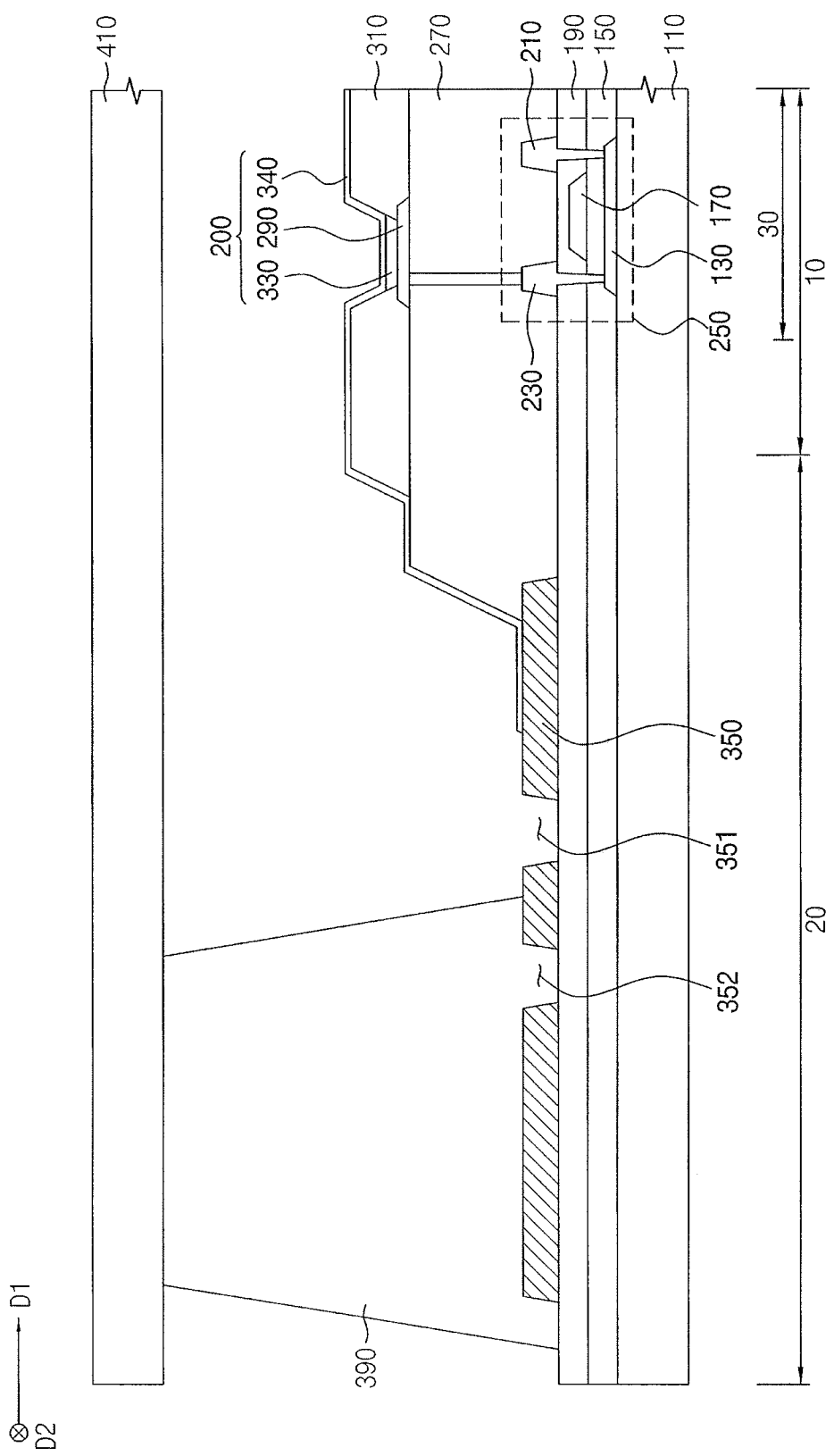
FIG. 11 illustrates a cross-sectional view of an example of the display device of FIG. 3A.

FIG. 11 illustrates a cross-sectional view of an example of the display device of FIG. 3A. A display device illustrated in FIG. 11 may have a configuration substantially a same as or similar to that of a display device 100 described with reference to FIGS. 3A, 3B, and 4. In FIG. 11, detailed descriptions for elements that are substantially a same as or similar to elements described with reference to FIGS. 3A, 3B, and 4 may not be repeated.

Referring to FIG. 11, a display device may include a lower substrate 110, a semiconductor element 250, a gate insulation layer 150, an insulating interlayer 190, a power supply voltage wiring 350, a planarization layer 270, a pixel structure 200, a pixel defining layer 310, a seal 390, an upper substrate 410, etc. Here, the pixel structure 200 may include a lower electrode 290, a light emitting layer 330, and an upper electrode 340, and the semiconductor element 250 may include an active layer 130, a gate electrode 170, a source electrode 210, and a drain electrode 230.

In an implementation, the upper electrode 340 may in direct contact with the power supply voltage wiring 350. For example, the upper electrode 340 may extend from a display region 10 to a peripheral region 20, and may be in direct contact with an upper surface of the planarization layer 270, a side wall of the planarization layer 270, and at least a portion of an upper surface of a portion of the power supply voltage wiring 350 protruded from the seal 390 in the peripheral region 20.

Figure 12:
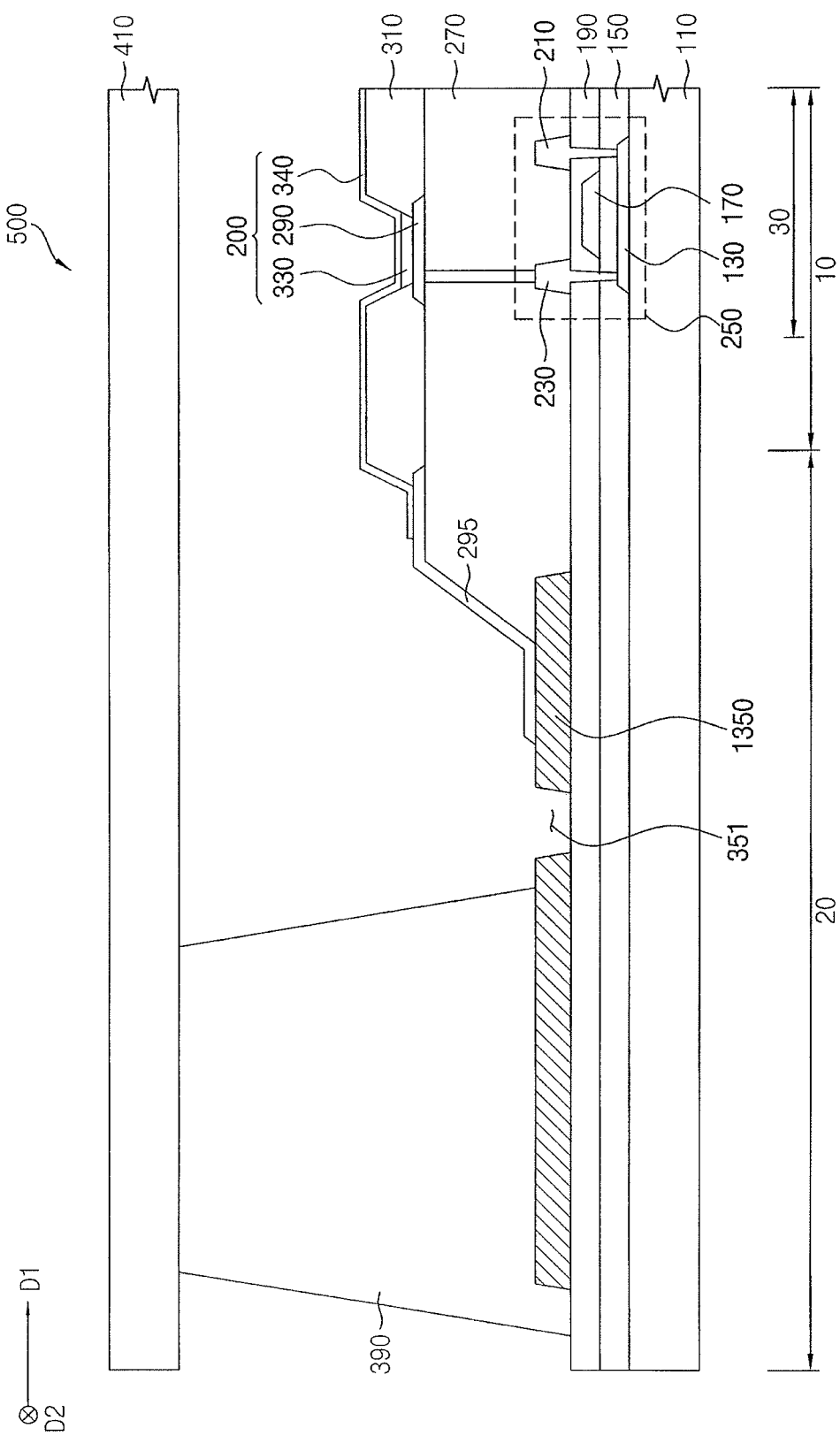
FIG. 12 illustrates a cross-sectional view of a display device in accordance with example embodiments.
Figure 13:
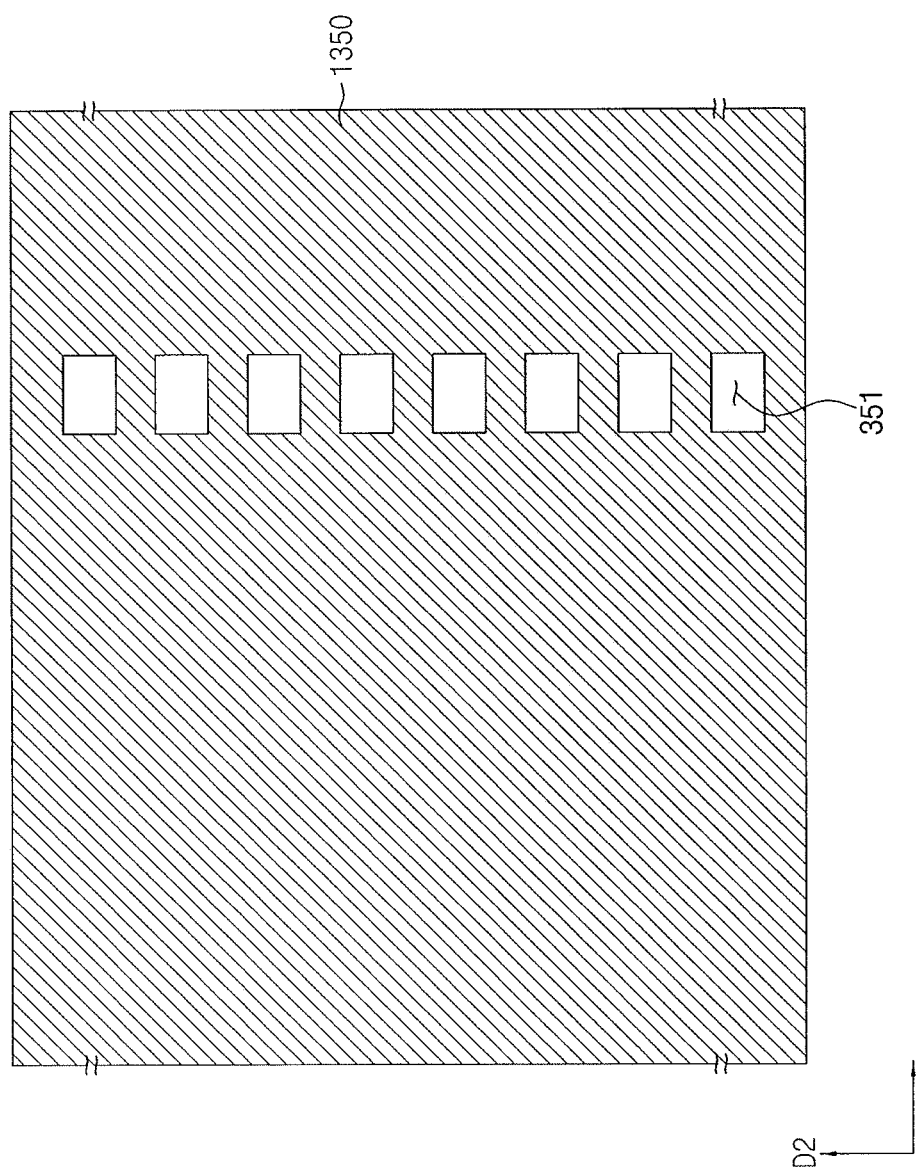
FIG. 13 illustrates a plan view of a power supply voltage wiring in the display device of FIG. 12.

FIG. 12 illustrates a cross-sectional view of a display device in accordance with example embodiments, and FIG. 13 illustrates a plan view of a power supply voltage wiring of the display device of FIG. 12. A display device 500 illustrated in FIGS. 12 and 13 may have a configuration substantially a same as or similar to that of a display device 100 described with reference to FIGS. 3A 3B, and 4 except for a power supply voltage wiring 1350. In FIGS. 12 and 13, detailed descriptions for elements that are substantially a same as or similar to elements described with reference to FIGS. 3A, 3B, and 4 may not be repeated.

Referring to FIGS. 12 and 13, a display device 500 may include a lower substrate 110, a semiconductor element 250, a gate insulation layer 150, an insulating interlayer 190, a power supply voltage wiring 1350, a planarization layer 270, a first connection pattern 295, a pixel structure 200, a pixel defining layer 310, a seal 390, an upper substrate 410, etc.

The power supply voltage wiring 1350 may be disposed between the seal 390 and the lower substrate 110 in the peripheral region 20, and may partially overlap the seal 390. For example, a portion of the power supply voltage wiring 1350 may be protruded from the seal 390 in a first direction D1 (that is a direction from the peripheral region 20 into the display region 10), and the power supply voltage wiring 1350 may have a plurality of first openings 351 therethrough in the protruded portion of the power supply voltage wiring 1350 as illustrated in FIG. 13. In an implementation, another portion of the power supply voltage wiring 1350 may overlap the seal 390. The first openings 351 may be located adjacent to a boundary between the display region 10 and the peripheral region 20, and may be arranged along the boundary. For example, the first openings 351 may be arranged in a second direction D2 that is perpendicular to the first direction D1. For example, the power supply voltage wiring 1350 may not include second openings.

Figure 14:
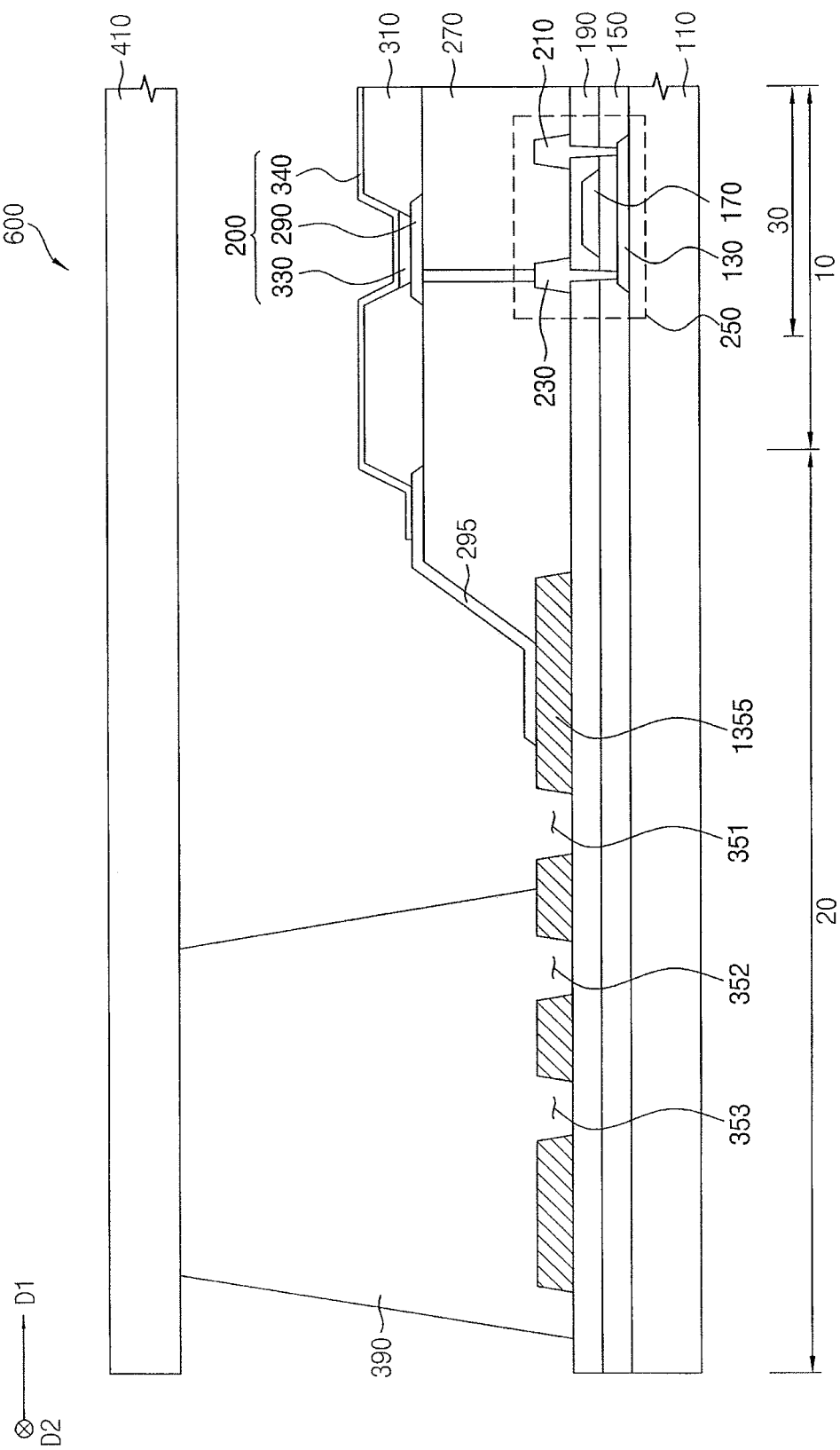
FIG. 14 illustrates a cross-sectional view of a display device in accordance with example embodiments.
Figure 15:
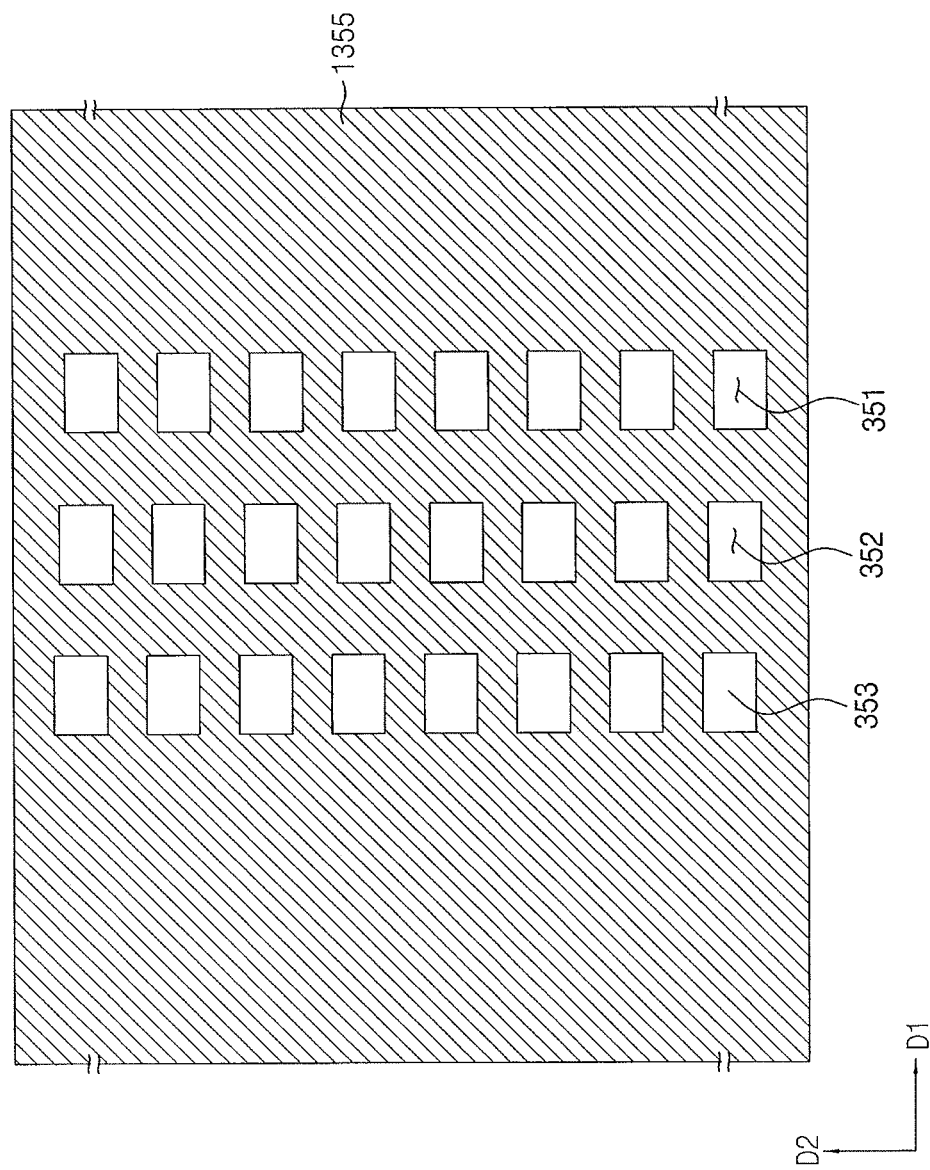
FIG. 15 illustrates a plan view of a power supply voltage wiring in the display device of FIG. 14.

FIG. 14 illustrates a cross-sectional view of a display device in accordance with example embodiments, and FIG. 15 illustrates a plan view of a power supply voltage wiring of the display device of FIG. 14. The display device 600 illustrated in FIGS. 14 and 15 may have a configuration substantially a same as or similar to that of a display device 100 described with reference to FIGS. 3A, 3B, and 4 except for a power supply voltage wiring 1355. In FIGS. 14 and 15, detailed descriptions for elements that are substantially a same as or similar to elements described with reference to FIGS. 3A, 3B, and 4 may not be repeated.

Referring to FIGS. 14 and 15, the display device 600 may include a lower substrate 110, a semiconductor element 250, a gate insulation layer 150, an insulating interlayer 190, a power supply voltage wiring 1355, a planarization layer 270, a first connection pattern 295, a pixel structure 200, a pixel defining layer 310, a seal 390, an upper substrate 410, etc.

The power supply voltage wiring 1355 may be disposed between the seal 390 and the lower substrate 110 in the peripheral region 20, and may partially overlap the seal 390. For example, a portion of the power supply voltage wiring 1355 may be protruded from the seal 390 in a first direction D1 (that is a direction from the peripheral region 20 into the display region 10), and the power supply voltage wiring 1355 may have a plurality of first openings 351 in the protruded portion of the power supply voltage wiring 1355 as illustrated in FIG. 15. In addition, another portion of the power supply voltage wiring 1355 may overlap (e.g., underlie) the seal 390, and may have a plurality of second openings 352 and a plurality of third openings 353 as illustrated in FIG. 15. The first openings 351 may be located adjacent to a boundary between the display region 10 and the peripheral region 20, and may be arranged along the boundary. For example, the first openings 351 may be arranged or spaced apart in a second direction D2 that is perpendicular to the first direction D1. The second openings 352 may be spaced apart from the first openings 351, and may be arranged such that the second openings 352 surround the first openings 351 (e.g., aligned with the first openings 351). In addition, the third openings 353 may be spaced apart from the second openings 352 by a predetermined distance, and may arranged along the second direction D2 that is in parallel to the second openings 352 (e.g., may be aligned with the second openings 352 and the first openings 351). The third openings 353 may surround the second openings 352.

The display device 600 according to example embodiments may include the power supply voltage wiring 1355 having the third openings 353, and heat caused by light of a laser and transmitted to the planarization layer 270 may be reduced.

Figure 16:
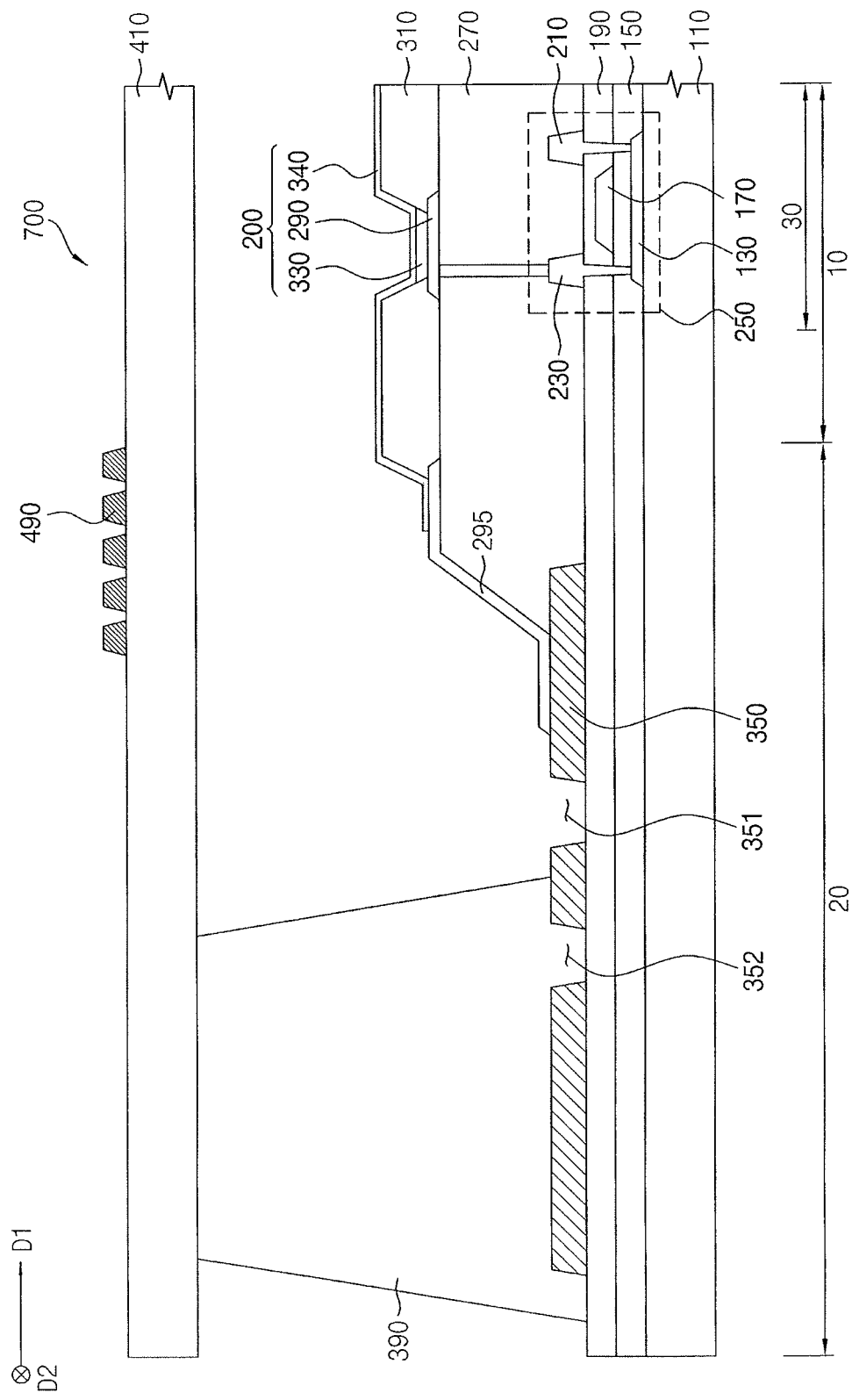
FIG. 16 illustrates a cross-sectional view of a display device in accordance with example embodiments.

FIG. 16 illustrates a cross-sectional view of a display device in accordance with example embodiments. The display device 700 illustrated in FIG. 16 may have a configuration substantially a same as or similar to that of a display device 100 described with reference to FIGS. 3A, 3B, and 4 except for a touch wiring structure 490. In FIG. 16, detailed descriptions for elements that are substantially a same as or similar to elements described with reference to FIGS. 3A, 3B, and 4 may not be repeated.

Referring to FIG. 16, the display device 700 may include a lower substrate 110, a semiconductor element 250, a gate insulation layer 150, an insulating interlayer 190, a power supply voltage wiring 350, a planarization layer 270, a first connection pattern 295, a pixel structure 200, a pixel defining layer 310, a seal 390, an upper substrate 410, a touch wiring structure 490, etc.

The touch wiring structure 490 may be disposed in the peripheral region 20 on the upper substrate 410. For example, the touch wiring structure 490 may be disposed along a boundary the display region 10 and the peripheral region 20, and may include a plurality of wirings. In an implementation, the display device 700 may further include a plurality of touch sensing electrodes that are electrically connected to the touch wiring structure 490 in the pixel region 30. For example, a touch sensing signal may be applied to the wirings included in the touch wiring structure 490, and the touch sensing signal may be provided to the touch sensing electrodes through the wirings of the touch wiring structure 490.

In an implementation, the touch wiring structure 490 may overlap the planarization layer 270 located in the peripheral region 20. For example, when light of a laser is irradiated on the seal 390 so as to seal the lower substrate 110 and the upper substrate 410, a portion of the light of the laser could be irradiated in the planarization layer 270 located in the peripheral region 20. To help prevent this, the touch wiring structure 490 may be disposed to overlap the planarization layer 270 located in the peripheral region 20, and may block an irradiation of the light of the laser.

Figure 17:
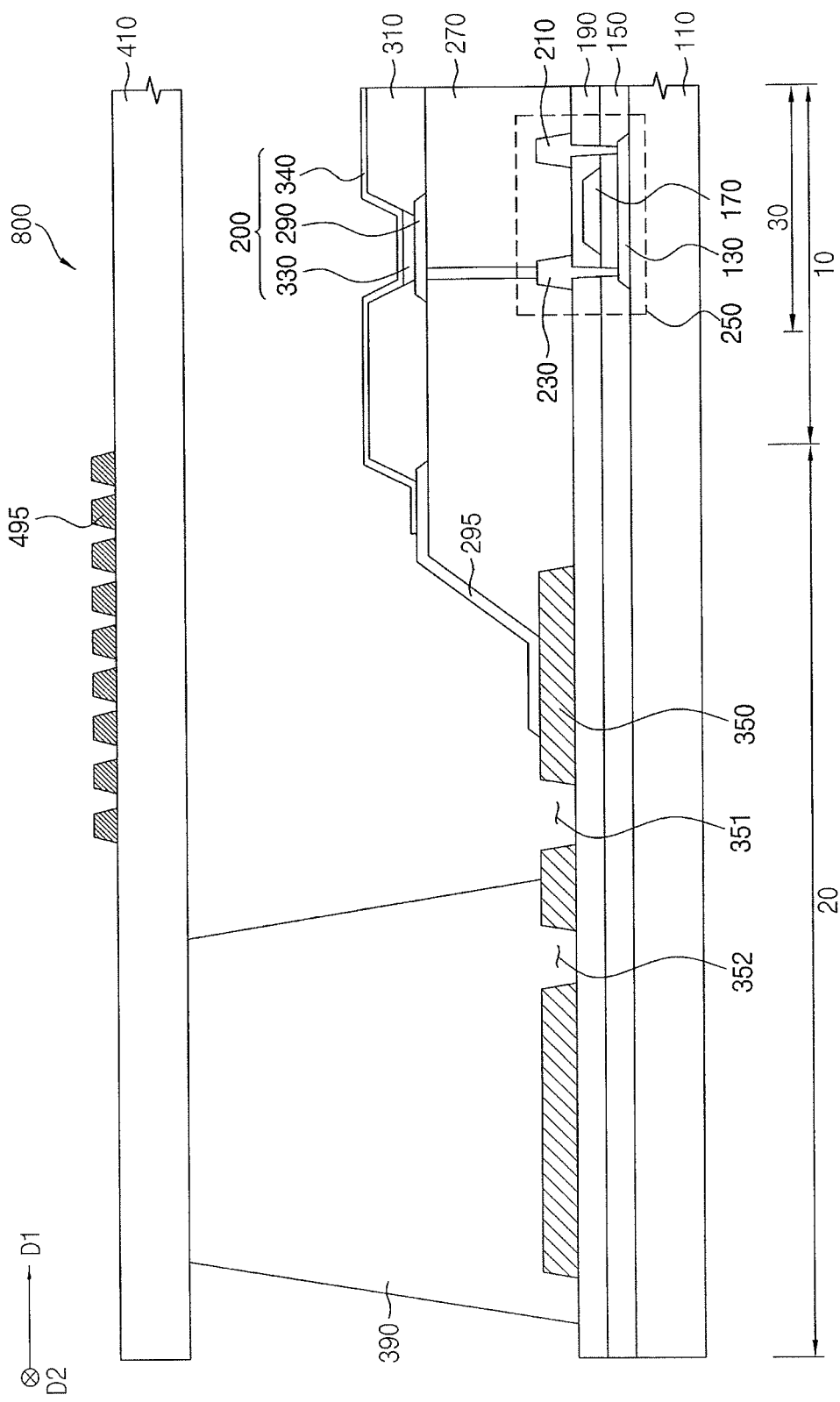
FIG. 17 illustrates a cross-sectional view of a display device in accordance with example embodiments.

FIG. 17 illustrates a cross-sectional view of a display device in accordance with example embodiments. The display device 800 illustrated in FIG. 17 may have a configuration substantially a same as or similar to that of a display device 700 described with reference to FIG. 16 except for a touch wiring structure 495. In FIG. 17, detailed descriptions for elements that are substantially a same as or similar to elements described with reference to FIG. 16 may not be repeated.

Referring to FIG. 17, the display device 800 may include a lower substrate 110, a semiconductor element 250, a gate insulation layer 150, an insulating interlayer 190, a power supply voltage wiring 350, a planarization layer 270, a first connection pattern 295, a pixel structure 200, a pixel defining layer 310, a seal 390, an upper substrate 410, a touch wiring structure 495, etc.

The touch wiring structure 495 may be disposed in the peripheral region 20 on the upper substrate 410. For example, the touch wiring structure 495 may be disposed along a boundary the display region 10 and the peripheral region 20, and may include a plurality of wirings. Compared to the touch wiring structure 490 of FIG. 16, the touch wiring structure 495 may include a relatively large number of wirings.

In an implementation, the touch wiring structure 495 may overlap the planarization layer 270 located in the peripheral region 20 and a portion of the power supply voltage wiring 350 protruded from the seal 390. For example, when light of a laser is irradiated on the seal 390 so as to seal the lower substrate 110 and the upper substrate 410, a portion of the light of the laser may be irradiated in the planarization layer 270 located in the peripheral region 20 and the portion of the power supply voltage wiring 350 protruded from the seal 390. To help prevent this, the touch wiring structure 495 may be disposed to overlap the planarization layer 270 located in the peripheral region 20 and the portion of the power supply voltage wiring 350 protruded from the seal 390, and may block an irradiation of the light of the laser.

Figure 18:
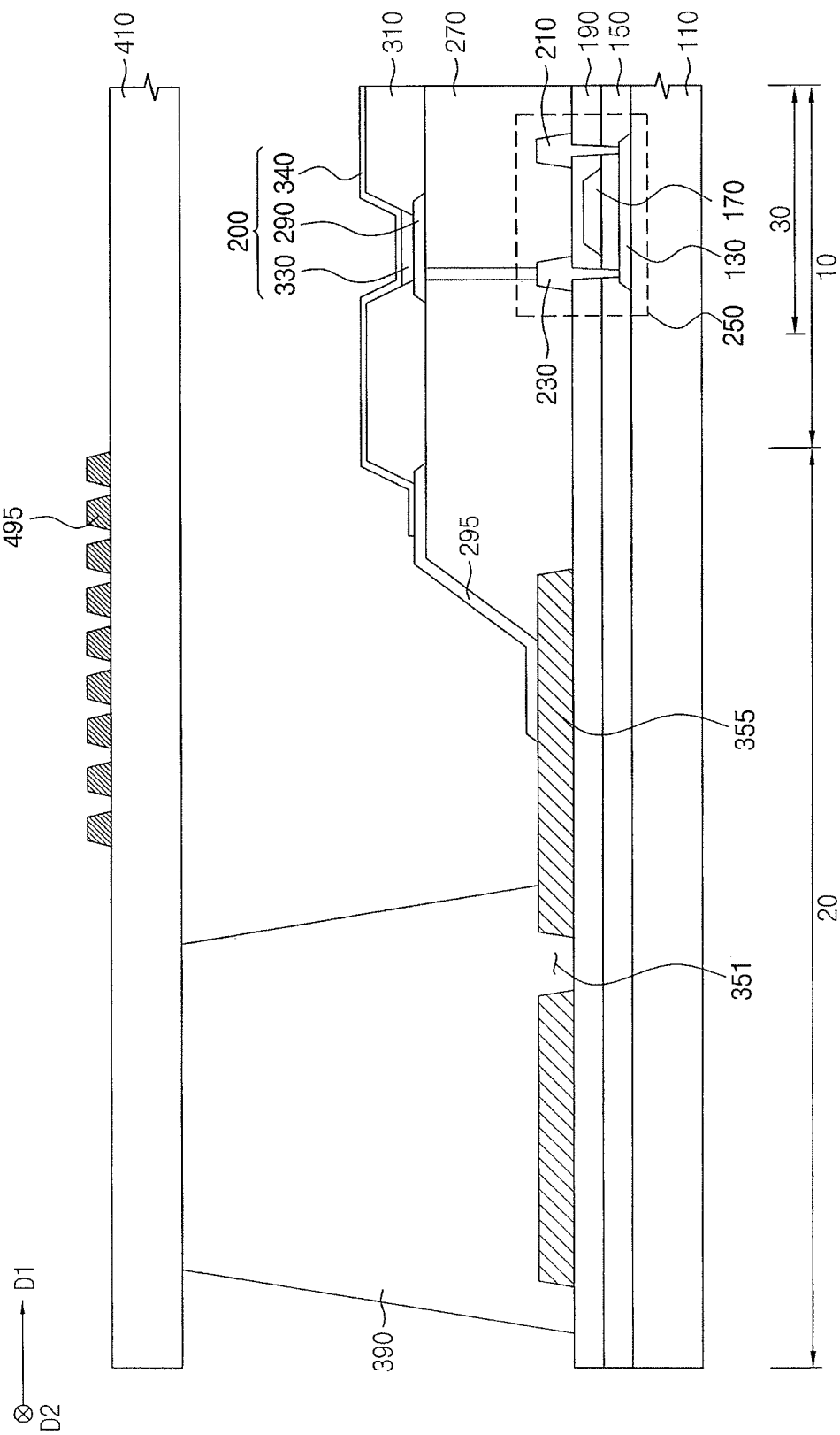
FIG. 18 illustrates a cross-sectional view of an example of the display device of FIG. 17.
Figure 19:
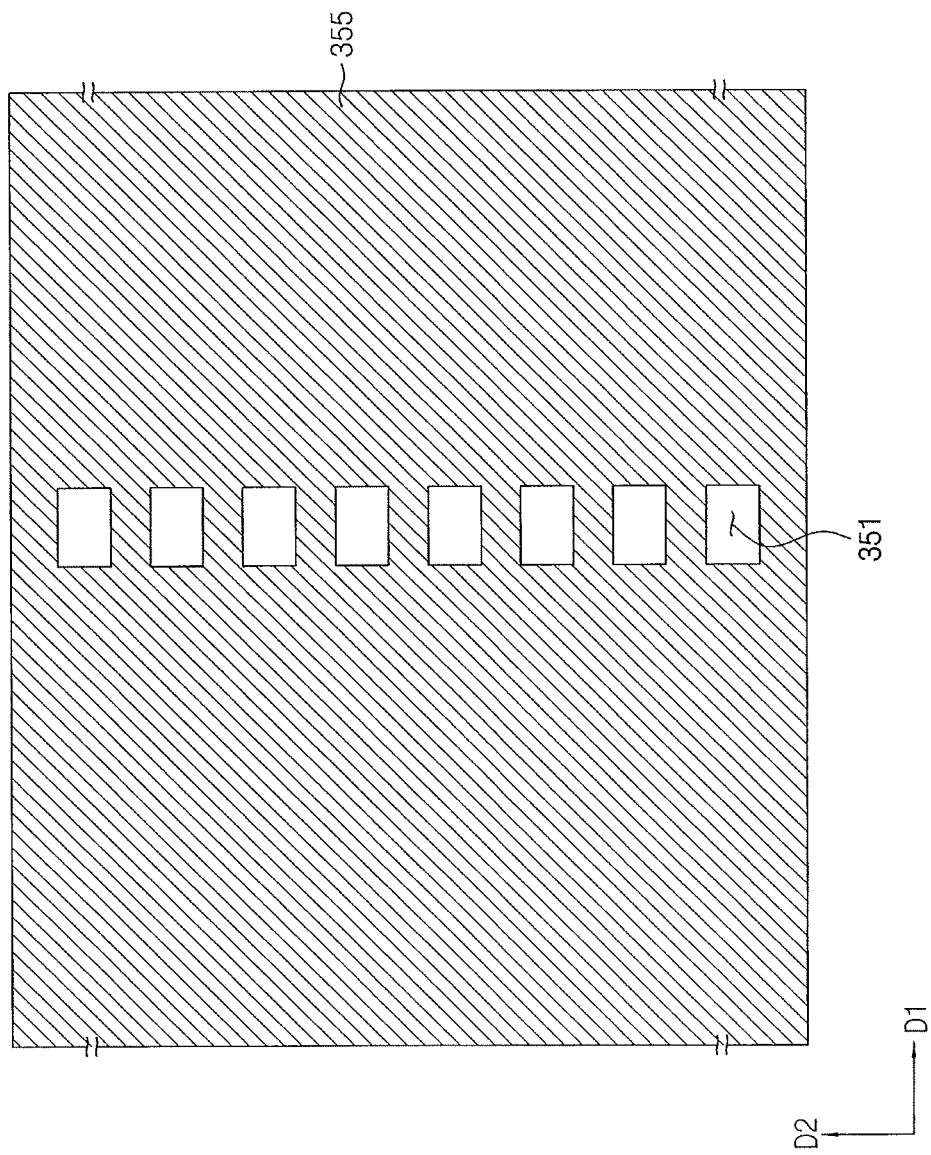
FIG. 19 illustrates a plan view of a power supply voltage wiring in the display device of FIG. 18.

FIG. 18 illustrates a cross-sectional view of an example of the display device of FIG. 17, and FIG. 19 illustrates a plan view of a power supply voltage wiring of the display device of FIG. 18. The display device illustrated in FIGS. 18 and 19 may have a configuration substantially a same as or similar to that of a display device 800 described with reference to FIG. 17 except for a power supply voltage wiring 355. In FIGS. 18 and 19, detailed descriptions for elements that are substantially a same as or similar to elements described with reference to FIG. 17 may not be repeated.

Referring to FIGS. 18 and 19, a display device may include a lower substrate 110, a semiconductor element 250, a gate insulation layer 150, an insulating interlayer 190, a power supply voltage wiring 355, a planarization layer 270, a first connection pattern 295, a pixel structure 200, a pixel defining layer 310, a seal 390, an upper substrate 410, a touch wiring structure 495, etc.

The power supply voltage wiring 355 may be disposed between the seal 390 and the lower substrate 110 in the peripheral region 20, and may partially overlap the seal 390. For example, a portion of the power supply voltage wiring 355 may be protruded from the seal 390 in a first direction D1 that is a direction from the peripheral region 20 into the display region 10, another portion of the power supply voltage wiring 355 may overlap the seal 390. As illustrated in FIG. 19, another portion of the power supply voltage wiring 355 may have a plurality of first openings 351.

Figure 20:
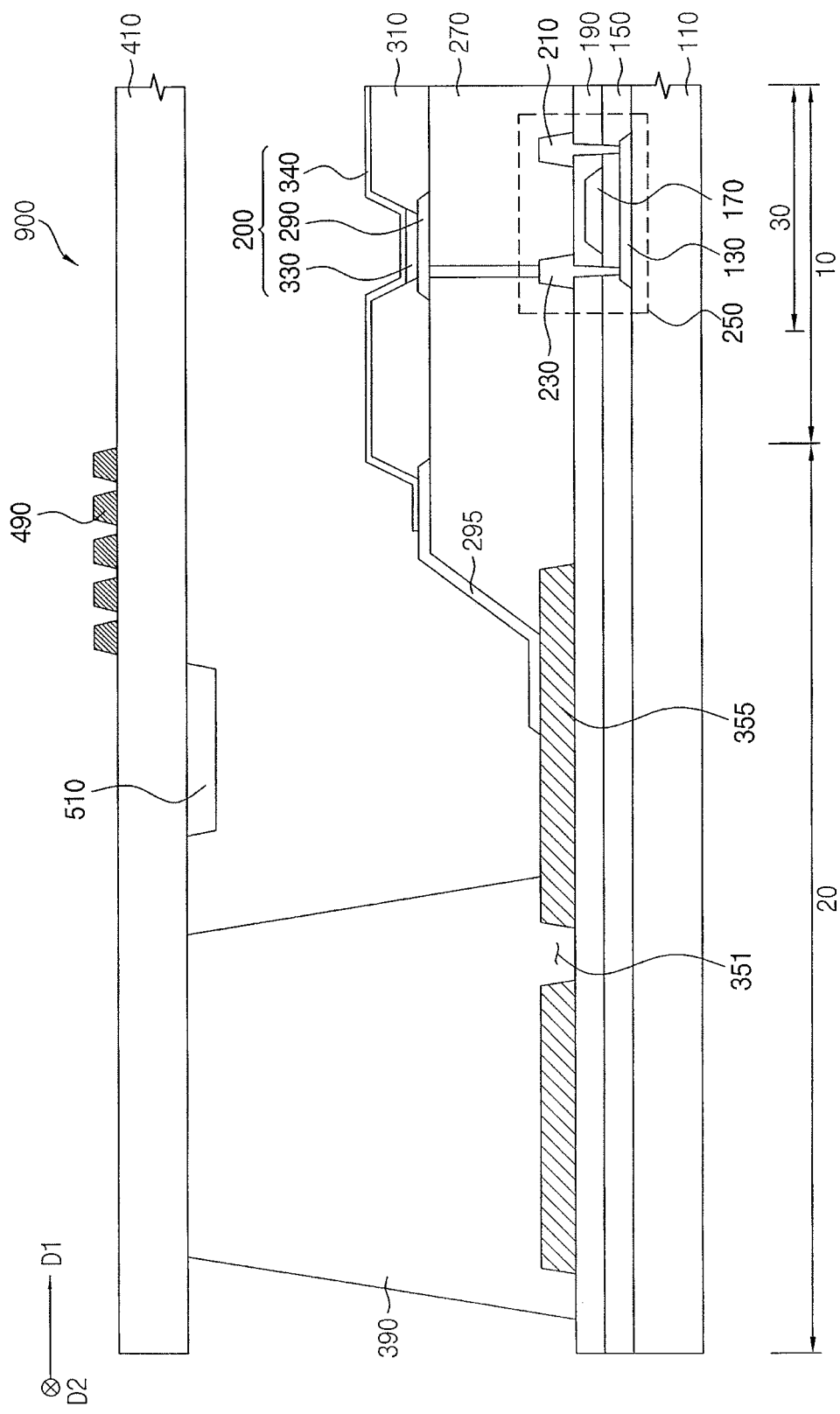
FIG. 20 illustrates a cross-sectional view of a display device in accordance with example embodiments.

FIG. 20 illustrates a cross-sectional view of a display device in accordance with example embodiments. The display device 900 illustrated in FIG. 20 may have a configuration substantially a same as or similar to that of a display device described with reference to FIGS. 18 and 19 except for a touch wiring structure 490 and a block 510. In FIG. 20, detailed descriptions for elements that are substantially a same as or similar to elements described with reference to FIGS. 18 and 19 may not be repeated.

Referring to FIGS. 18 and 19, the display device 900 may include a lower substrate 110, a semiconductor element 250, a gate insulation layer 150, an insulating interlayer 190, a power supply voltage wiring 355, a planarization layer 270, a first connection pattern 295, a pixel structure 200, a pixel defining layer 310, a seal 390, a touch wiring structure 490, a blocker 510, an upper substrate 410, a touch wiring structure 495, etc.

The touch wiring structure 490 may be disposed in the peripheral region 20 on the upper substrate 410. In an implementation, the display device 900 may further include a plurality of touch sensing electrodes that are electrically connected to the touch wiring structure 490 in the pixel region 30. For example, a touch sensing signal may be applied to the wirings included in the touch wiring structure 490, and the touch sensing signal may be provided to the touch sensing electrodes through the wirings of the touch wiring structure 490. In an implementation, the touch wiring structure 490 may overlap the planarization layer 270 located in the peripheral region 20. For example, the touch wiring structure 490 may overlap at least a portion of the power supply voltage wiring 355 protruded from the seal 390.

The blocker 510 may be disposed in the peripheral region 20 on a lower surface of the upper substrate 410, and may surround the touch wiring structure 490. In an implementation, the blocker 510 may overlap a remaining portion of the power supply voltage wiring 355 protruded from the seal 390. The blocker 510 may block light. For example, the blocker 510 may include a black matrix. The black matrix may include black materials. The black materials capable of being used as the black matrix may include carbon black, phenylene black, aniline black, cyanine black, nigrosine acid black, black resin, or the like.

For example, when light of a laser is irradiated on the seal 390 so as to seal the lower substrate 110 and the upper substrate 410, a portion of the light of the laser could be irradiated in the planarization layer 270 located in the peripheral region 20 and the portion of the power supply voltage wiring 355 protruded from the seal 390. To help prevent this, the touch wiring structure 490 may be disposed to overlap the at least a portion of the power supply voltage wiring 355 protruded from the seal 390, and the blocker 510 may overlap the remaining portion of the power supply voltage wiring 355 protruded from the seal 390. The touch wiring structure 490 and the blocker 510 may block irradiation of the light of the laser.

Figure 21:
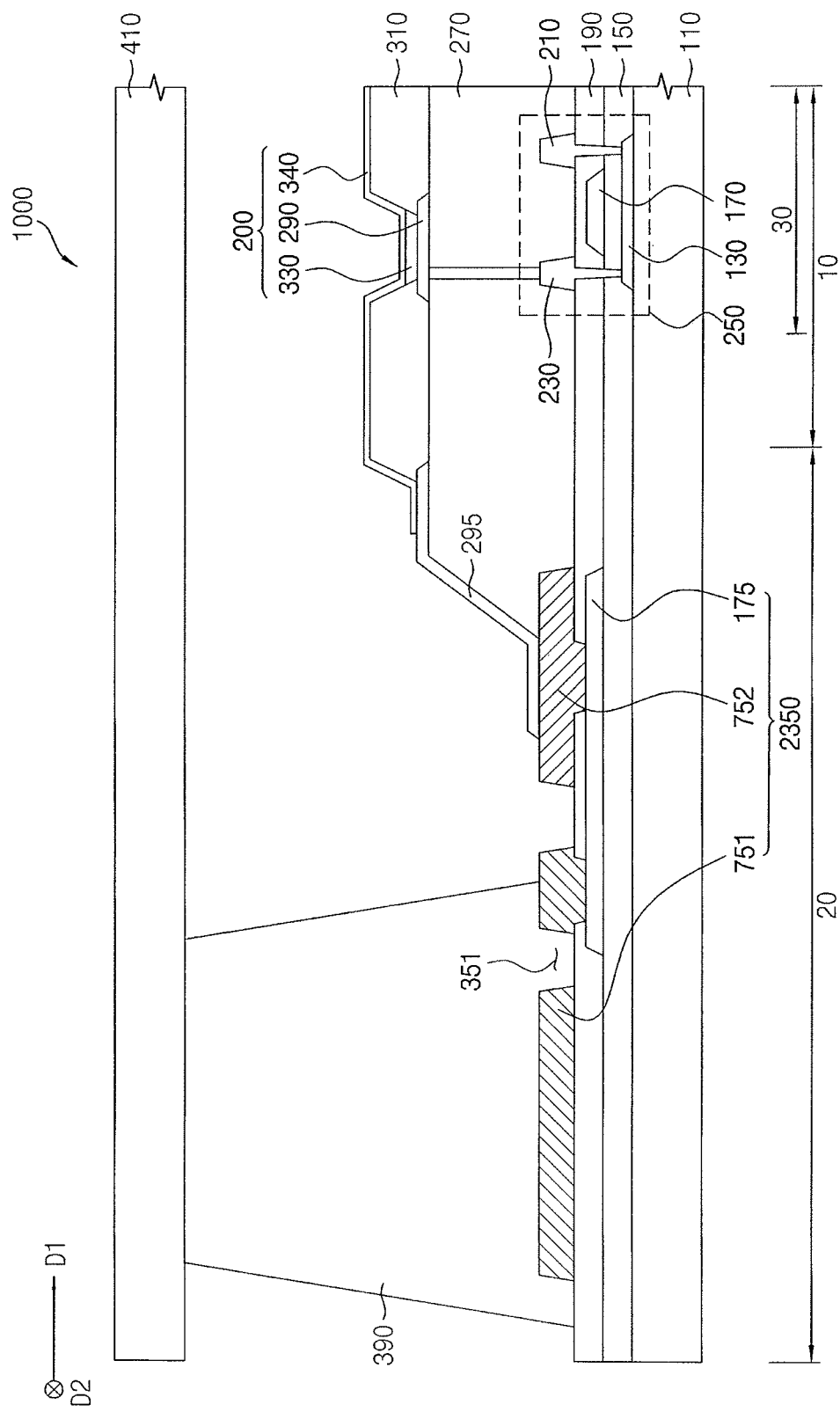
FIG. 21 illustrates a cross-sectional view of a display device in accordance with example embodiments.
Figure 22:
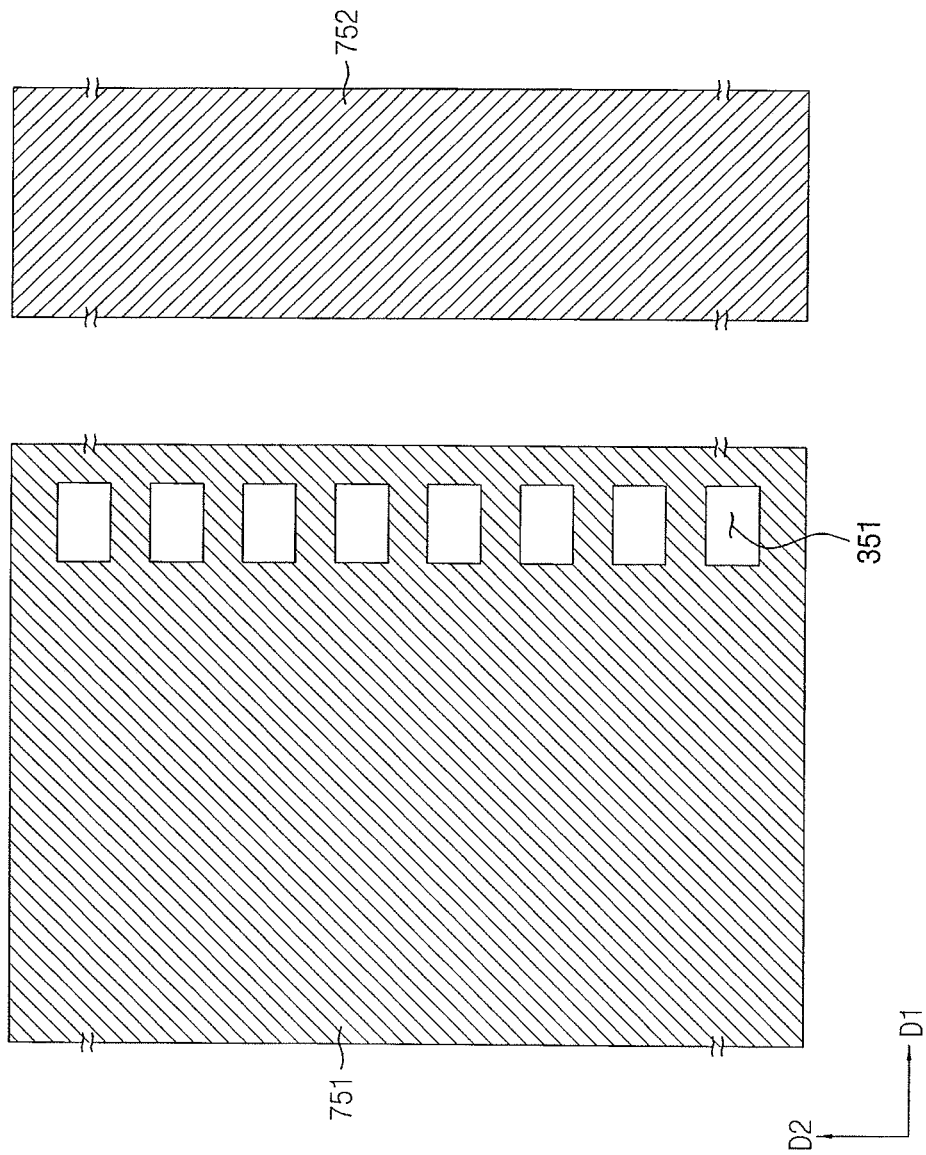
FIG. 22 illustrates a plan view of a power supply voltage wiring in the display device of FIG. 21.
Figure 23:
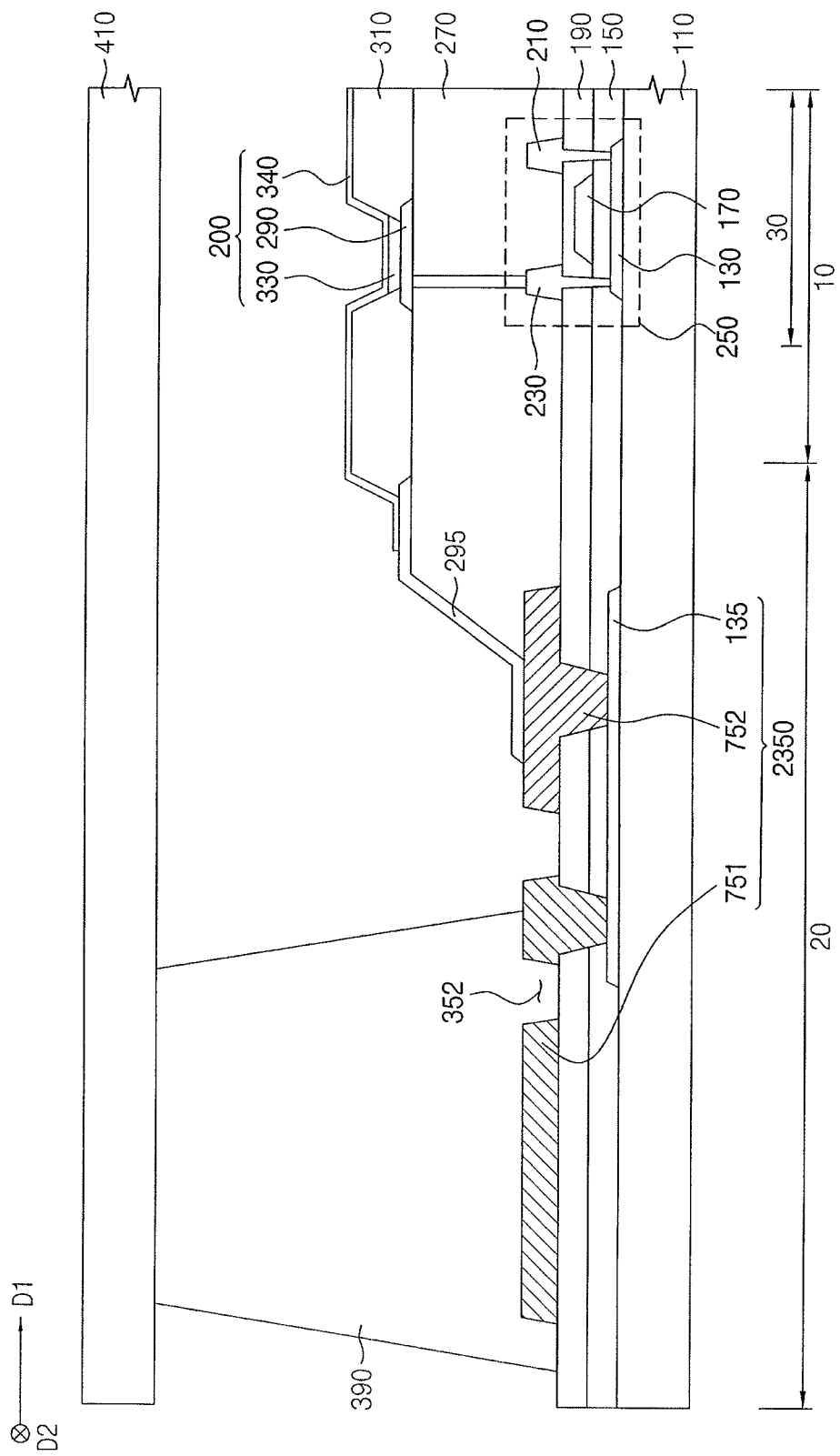
FIG. 23 illustrates a cross-sectional view of an example of the display device of FIG. 21.

FIG. 21 illustrates a cross-sectional view of a display device in accordance with example embodiments, and FIG. 22 illustrates a plan view of a power supply voltage wiring illustrated in the display device of FIG. 21. FIG. 23 illustrates a cross-sectional view of an example of the display device of FIG. 21.

A display device 1000 illustrated in FIGS. 21 and 22 may have a configuration substantially a same as or similar to that of a display device 100 described with reference to FIGS. 3A, 3B, and 4 except for a power supply voltage wiring 2350. In FIGS. 21 and 22, detailed descriptions for elements that are substantially a same as or similar to elements described with reference to FIGS. 3A, 3B, and 4 may not be repeated.

Referring to FIGS. 21 and 22, a display device 1000 may include a lower substrate 110, a semiconductor element 250, a gate insulation layer 150, an insulating interlayer 190, a power supply voltage wiring 2350, a planarization layer 270, a first connection pattern 295, a pixel structure 200, a pixel defining layer 310, a seal 390, an upper substrate 410, etc. Here, the pixel structure 200 may include a lower electrode 290, a light emitting layer 330, and an upper electrode 340, and the semiconductor element 250 may include an active layer 130, a gate electrode 170, a source electrode 210, and a drain electrode 230. In addition, a power supply voltage wiring 2350 may include a first wiring pattern 751, a second wiring pattern 752, and a second connection pattern 175.

The second connection pattern 175 may be disposed in the peripheral region 20 on the gate insulation layer 150. The second connection pattern 175 may be spaced apart from the gate electrode 170, and the second connection pattern 175 and the gate electrode 170 may be located at a same layer. The second connection pattern 175 may electrically connect the first wiring pattern 751 and the second wiring pattern 752. The second connection pattern 175 may include a metal, an alloy of a metal, metal nitride, conductive metal oxide, transparent conductive materials, or the like. These may be used alone or in a suitable combination thereof. In an implementation, the second connection pattern 175 may have a multi-layered structure including a plurality of layers.

The first wiring pattern 751 may be disposed between the seal 390 and the lower substrate 110 in the peripheral region 20, and may partially overlap the seal 390. In an implementation, as illustrated in FIG. 22, the first wiring pattern 751 may have a plurality of first openings 351. The first openings 351 may be arranged in a second direction D2 that is perpendicular to a first direction D1. The first wiring pattern 751 may be in contact with the second connection pattern 175 through a contact hole formed by removing a first portion of the insulating interlayer 190.

The second wiring pattern 752 may be spaced apart from the first wiring pattern 751 in the first direction D1, and may overlap a portion of the planarization layer 270 located in the peripheral region 20. The second wiring pattern 752 may be in contact with the second connection pattern 175 through a contact hole formed by removing a second portion of the insulating interlayer 190.

Each of the first wiring pattern 751 and the second wiring pattern 752 may include a metal, an alloy of a metal, metal nitride, conductive metal oxide, transparent conductive materials, or the like. These may be used alone or in a suitable combination thereof. In an implementation, each of the first and second wiring patterns 751 and 752 may have a multi-layered structure including a plurality of layers. In an implementation, the first wiring pattern 751, the second wiring pattern 752, the source electrode 210, and the drain electrode 230 may be located at a same layer, may be simultaneously formed using same materials. Accordingly, the power supply voltage wiring 2350 including the first wiring pattern 751, the second wiring pattern 752, and the second connection pattern 175 may be constituted. In an implementation, as illustrated in FIG. 23, the first wiring pattern 751 and the second wiring pattern 752 may be electrically connected through a second connection pattern 135 that is located at a same layer with the active layer 130.

The display device 1000 in accordance with example embodiments may include the power supply voltage wiring 2350 including the first wiring pattern 751 that is electrically connected through the second connection pattern 175 and the second wiring pattern 752 that is spaced apart from the first wiring pattern 751, heat caused by light of a laser transmitted to the planarization layer 270 may be reduced. Accordingly, an out-gassing phenomenon may not occur in the planarization layer 270.

The embodiments may be applied to various display devices including a display device. For example, the embodiments may be applied to vehicle-display device, a ship-display device, an aircraft-display device, portable communication devices, display devices for display or for information transfer, a medical-display device, or the like.

By way of summation and review, when the light of the laser is irradiated in or on the seal, the power supply voltage wiring may be heated, and the heat may be transmitted to an organic layer (e.g., a planarization layer and/or a pixel defining layer) through the power supply voltage wiring. In this case, an out-gassing phenomenon may occur in the organic layer heated by power supply voltage wiring. Accordingly, a failure of the display device could occur.

The embodiments may provide a display device including a power supply voltage wiring.

As the display device according to example embodiments includes the power supply voltage wiring having the first openings, the display device may be relatively reduced that heat by light of a laser is transmitted to the planarization layer. Accordingly, an out-gassing phenomenon may not occur in the planarization layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
a lower substrate having:
a display region including a plurality of pixel regions, and
a peripheral region surrounding the display region;
a plurality of pixel structures in the plurality of pixel regions on the lower substrate;
an upper substrate on the plurality of pixel structures;
a seal between the lower substrate and the upper substrate in the peripheral region; and
a power supply voltage wiring between the seal and the lower substrate in the peripheral region, wherein:
the power supply voltage wiring partially overlaps the seal,
the power supply voltage wiring includes a plurality of first openings,
the first openings are formed in a portion, which protrudes from a side wall of the seal in a first direction extending from the peripheral region into the display region, of the power supply voltage wiring, and
the side wall of the seal is a boundary of the seal located most adjacent to the pixel structures.

2. The display device as claimed in claim 1, wherein the first openings are arranged along a boundary of the display region and the peripheral region in a second direction that is perpendicular to the first direction.

3. The display device as claimed in claim 1, wherein the power supply voltage wiring further includes a plurality of second openings in a portion thereof that overlap the seal.

4. The display device as claimed in claim 3, wherein:
the second openings are spaced apart from the first openings by a predetermined distance,
the first openings and the second openings are arranged in a second direction that is perpendicular to the first direction, and
the first openings and the second openings are aligned in parallel to each other.

5. The display device as claimed in claim 3, further comprising a plurality of semiconductor elements between the lower substrate and the pixel structures,
wherein each of the semiconductor elements includes:
an active layer on the lower substrate;
a gate electrode on the active layer; and
source and drain electrodes on the gate electrode.

6. The display device as claimed in claim 5, wherein the power supply voltage wiring and the source and drain electrodes are located at a same layer.

7. The display device as claimed in claim 5, further comprising:
a gate insulation layer on the lower substrate, the gate insulation layer covering the active layer;
an insulating interlayer on the gate insulation layer, the insulating interlayer covering the gate electrode;
a planarization layer on the insulating interlayer, the planarization layer covering the source and drain electrodes; and
a pixel defining layer on the planarization layer.

8. The display device as claimed in claim 7, wherein the seal is in contact with an upper surface of the planarization layer through the second openings.

9. The display device as claimed in claim 7, wherein at least a part of the power supply voltage wiring protruding inwardly from the seal overlaps and directly contacts the planarization layer.

10. The display device as claimed in claim 3, wherein:
the power supply voltage wiring further includes a plurality of third openings spaced apart from the second openings by a predetermined distance, the third openings being arranged in a second direction that is perpendicular to the first direction, and
the second openings and the third openings are aligned in parallel to each other.

11. The display device as claimed in claim 1, further comprising a touch wiring structure along a boundary of the display region and the peripheral region on the upper substrate in the peripheral region, the touch wiring structure including a plurality of wirings.

12. The display device as claimed in claim 11, wherein the touch wiring structure overlaps the portion of the power supply voltage wiring protruding inwardly from the seal.

13. The display device as claimed in claim 1, wherein the plurality of pixel structures includes:
a plurality of lower electrodes;
a plurality of light emitting layers on the lower electrodes; and
an upper electrode on the light emitting layers.

14. The display device as claimed in claim 13, wherein:
the upper electrode extends from the display region into the peripheral region, and
the upper electrode located in the peripheral region is electrically connected to the power supply voltage wiring.

15. The display device as claimed in claim 14, further comprising a first connection pattern between the upper electrode and the power supply voltage wiring,
wherein the upper electrode and the power supply voltage wiring are electrically connected through the first connection pattern.

16. The display device as claimed in claim 15, wherein:
a first end of the first connection pattern is in direct contact with the upper electrode,
a second end of the first connection pattern is in direct contact with the power supply voltage wiring, and
the first connection pattern and the plurality of lower electrodes are located at a same layer.

17. A display device, comprising:
a lower substrate having:
a display region including a plurality of pixel regions, and
a peripheral region surrounding the display region;
a plurality of pixel structures in the plurality of pixel regions on the lower substrate;
an upper substrate on the plurality of pixel structures;
a seal between the lower substrate and the upper substrate in the peripheral region;
a power supply voltage wiring between the seal and the lower substrate in the peripheral region, the power supply voltage wiring partially overlapping the seal, the power supply voltage wiring including a plurality of first openings in a portion thereof that are overlapped and at least partially filled with the seal, and the power supply voltage wiring having a portion that protrudes inwardly from the seal in a first direction extending from the peripheral region into the display region;
a touch wiring structure along a boundary between the display region and the peripheral region in the peripheral region on the upper substrate, the touch wiring structure overlapping the portion of the power supply voltage wiring that protrudes inwardly from the seal; and
a blocker surrounding the touch wiring structure in the peripheral region on a lower surface of the upper substrate, the blocker overlapping a remaining portion of the power supply voltage wiring protruded from the seal.

18. The display device as claimed in claim 17, wherein each of the plurality of first openings directly contacts an insulating layer below the power supply voltage wiring.

* * * * *